United States Patent
Geffin et al.

(10) Patent No.: US 10,061,371 B2
(45) Date of Patent: Aug. 28, 2018

(54) SYSTEM AND METHOD FOR MONITORING AND MANAGING DATA CENTER RESOURCES IN REAL TIME INCORPORATING MANAGEABILITY SUBSYSTEM

(75) Inventors: Steven Geffin, Miami, FL (US); Richard M. Tobin, Marysville, OH (US); Kyle Keeper, Westerville, OH (US); James H. Shelton, Cooper City, FL (US); Bharat A. Khuti, Huntsville, AL (US); Michael W. Velten, Delaware, OH (US); Aman Khan, Bethel, CT (US); Dai Jun, Shenzhen (CN); Yang Pu, Shenzhen (CN)

(73) Assignee: AVOCENT HUNTSVILLE, LLC, Huntsville, AL (US)

( * ) Notice: Subject to any disclaimer, the term of this patent is extended or adjusted under 35 U.S.C. 154(b) by 370 days.

(21) Appl. No.: 13/877,524

(22) PCT Filed: Sep. 30, 2011

(86) PCT No.: PCT/US2011/054300
§ 371 (c)(1),
(2), (4) Date: May 21, 2013

(87) PCT Pub. No.: WO2012/047757
PCT Pub. Date: Apr. 12, 2012

(65) Prior Publication Data
US 2013/0238795 A1    Sep. 12, 2013

Related U.S. Application Data

(60) Provisional application No. 61/389,616, filed on Oct. 4, 2010, provisional application No. 61/488,361, filed on May 20, 2011.

(51) Int. Cl.
G06F 15/173 (2006.01)
G06F 1/32 (2006.01)
(Continued)

(52) U.S. Cl.
CPC ............ *G06F 1/3206* (2013.01); *G06F 1/206* (2013.01); *G06F 1/3203* (2013.01); *G06F 8/24* (2013.01);
(Continued)

(58) Field of Classification Search
CPC ..... H04L 41/06; H04L 41/22; H04L 41/0213; H04L 41/0226; H04L 41/0253; H04L 12/2803; G06F 11/323; G06F 11/3636
(Continued)

(56) References Cited

U.S. PATENT DOCUMENTS 6,526,442 B1 *  2/2003  Stupek, Jr. .......... H04L 41/0213
                                                        709/224
6,587,950 B1 *  7/2003  Shah .................... G06F 1/3203
                                                        713/300
(Continued)

OTHER PUBLICATIONS

International Search Report and Written Opinion for PCT/US2011/054300, dated Dec. 6, 2011; ISA/EP.

*Primary Examiner* — Larry Donaghue
*Assistant Examiner* — Patrick Ngankam
(74) *Attorney, Agent, or Firm* — Harness, Dickey & Pierce, P.L.C.

(57) ABSTRACT

The present disclosure is directed to a system for controlling a plurality of managed devices. The system may involve a manageability services module adapted to facilitate communication between the plurality of managed devices and a central user located remotely from the plurality of managed devices. The system may also involve a manageability engine module that communicates with the manageability services module. The manageability engine module may
(Continued)

have an element library storing parameters associated with the plurality of managed devices, and may be configured to perform a number of useful operations such as: facilitating communication between the managed devices and the manageability services module; discovering a new managed device; and collecting, aggregating and providing real time analytics on the data collected from the managed devices. A database may be used to store data collected by the manageability engine module.

22 Claims, 61 Drawing Sheets

(51) Int. Cl.
    *G06F 1/20* (2006.01)
    *G06F 8/20* (2018.01)
    *G06F 11/30* (2006.01)
    *H04L 12/24* (2006.01)
    *H05K 7/20* (2006.01)
    *G06F 11/34* (2006.01)

(52) U.S. Cl.
    CPC ...... *G06F 11/3006* (2013.01); *G06F 11/3044* (2013.01); *G06F 11/3051* (2013.01); *G06F 11/3058* (2013.01); *G06F 11/3072* (2013.01); *H04L 41/0226* (2013.01); *H04L 41/50* (2013.01); *H05K 7/20836* (2013.01); *G06F 11/3409* (2013.01); *H04L 41/0253* (2013.01); *H04L 41/04* (2013.01); *Y02D 10/16* (2018.01); *Y02D 10/34* (2018.01)

(58) Field of Classification Search
    USPC .................................... 709/224, 226; 714/37
    See application file for complete search history.

(56) References Cited

U.S. PATENT DOCUMENTS

| | | | |
|---|---|---|---|
| 7,930,396 B2 * | 4/2011 | Trinon | G06Q 10/06 705/348 |
| 2002/0158898 A1 * | 10/2002 | Hsieh | G06F 8/61 715/736 |
| 2005/0129035 A1 | 6/2005 | Saito | |
| 2008/0281912 A1 | 11/2008 | Dillenberger et al. | |
| 2009/0172704 A1 * | 7/2009 | Ingle | G06Q 10/00 719/321 |
| 2010/0005331 A1 | 1/2010 | Somasundaram et al. | |
| 2011/0077795 A1 * | 3/2011 | VanGilder | G06F 1/206 700/300 |
| 2011/0283144 A1 * | 11/2011 | Nano | G06F 11/323 714/37 |

* cited by examiner

| | |
|---|---|
| Description | Start an MSS Engine<br><br>MSS Services provides the ability to starts an MSS Engine. When the MSS Engine starts, the MSS Engine starts running high priority processes (e.g., discovery, collection, events). |
| Actors | MSS Services |
| Pre-Conditions | MSS Services has successfully discovered some MSS Engine(s) on the network. |
| Post-Conditions | <u>Success end condition</u><br><br>MSS Services returns a response indicating that the MSS Engine was successfully started.<br><br><u>Failure end condition</u><br><br>MSS Services returns a response indicating that the MSS Engine failed to start.<br><br><u>Minimal Guarantee</u><br><br>A response will be returned indicating either success or failure. |
| Trigger | A request is made for MSS Services to start an MSS Engine. |
| Main Flow | 1. MSS Services starts high priority processes (e.g., discovery, collection, events).<br>2. MSS Services generates an event indicating the MSS Engine has started. |
| Alternate Flows | In Step 1 of main flow, if the MSS Engine is unable to start<br><br>2. MSS Services generates an event indicating that the MSS Engine failed to start. |
| Assumptions | None. |
| Exceptions | None. |
| Variations | None. |
| Notes and Issues | None. |

FIGURE 12

| | |
|---|---|
| Description | Stop an MSS Engine<br><br>MSS Services provides the ability to stop an MSS Engine. When the MSS Engine stops, the MSS Engine stops all processes (e.g., including discovery, collection, events). |
| Actors | MSS Services |
| Pre-Conditions | MSS Services has successfully discovered some MSS Engine(s) on the network.<br><br>The MSS Engine has been previously started. |
| Post-Conditions | Success end condition<br><br>MSS Services returns a response indicating that the MSS Engine was successfully stopped.<br><br>Failure end condition<br><br>MSS Services returns a response indicating that the MSS Engine failed to stop.<br><br>Minimal Guarantee<br><br>A response will be returned indicating either success or failure. |
| Trigger | A request is made for MSS Services to stop an MSS Engine. |
| Main Flow | 1. MSS Services stops all processes (e.g., including discovery, collection, events).<br>2. MSS Services generates an event indicating the MSS Engine has stopped. |
| Alternate Flows | In Step 1 of main flow, if the MSS Engine is unable to start<br><br>2. MSS Services generates an event indicating that the MSS Engine failed to stop. |
| Assumptions | None. |
| Exceptions | None. |
| Variations | None. |
| Notes and Issues | None. |

FIGURE 13

| | |
|---|---|
| Description | Install an Element Library on an MSS Engine.<br><br>Often new element libraries are developed to support discovery, collection and control for an existing or new hardware device. MSS Engine will support the installation of new element libraries that can be used to interact with the hardware device. |
| Actors | MSS Services |
| Pre-Conditions | MSS Services has successfully discovered some MSS Engine(s) on the network and the MSS Engine is currently collecting. |
| Post-Conditions | <u>Success end condition</u><br><br>MSS Services returns a response indicating that the element library was successfully installed.<br><br><u>Failure end condition</u><br><br>MSS Services returns a response indicating that the element library failed to install.<br><br><u>Minimal Guarantee</u><br><br>MSS Services returns a response indicating success or failure. |
| Trigger | A request is received indicating that an element library should be installed. The location of the element library (either local to the MSS Engine or on a shared network drive) is specified in the request. |
| Main Flow | 1. MSS Services transfers the element library to the MSS Engine.<br>2. MSS Services sends a request to the MSS Engine that a new element library should be installed. The request indicates the location (either local to the MSS Engine or on a shared network drive) of the new element library.<br>3. The MSS Engine returns a response indicating that the element library was successfully installed.<br>4. MSS Services returns a response indicating that the element library was successfully installed. |
| Alternate Flows | File transfer fails<br><br>1. MSS Services informs the calling component that the installation failed due to 'failed file transfer'.<br><br>Installation failed<br><br>3. The MSS Engine returns a response indicating that the element library failed to install.<br>4. MSS Services returns a response indicating that the element library failed to install. |

FIGURE 14A

| Assumptions | None. |
|---|---|
| Exceptions | None. |
| Variations | None. |
| Notes and Issues | None. |

FIGURE 14B

| | |
|---|---|
| Description | Update an Element Library on an MSS Engine.<br><br>Often element libraries are enhanced or bugs are fixed. MSS Engine will support the update of element libraries. |
| Actors | MSS Services |
| Pre-Conditions | MSS Services has successfully discovered some MSS Engine(s) on the network and the MSS Engine is currently collecting. |
| Post-Conditions | <u>Success end condition</u><br><br>MSS Services returns a response indicating that the element library was successfully updated.<br><br><u>Failure end condition</u><br><br>MSS Services returns a response indicating that the element library failed to update.<br><br>OR<br><br>MSS Services informs the calling component that the update failed due to 'failed file transfer'.<br><br><u>Minimal Guarantee</u><br><br>MSS Services returns a response indicating success or failure. |
| Trigger | A request is received indicating that an element library should be updated. The location of the element library (either local to the MSS Engine or on a shared network drive) is specified in the request. |
| Main Flow | 1. MSS Services transfers the element library to the MSS Engine.<br><br>2. MSS Services sends a request to the MSS Engine that an element library should be updated. The request indicates the location (either local to the MSS Engine or on a shared network drive) of the new element library.<br><br>3. The MSS Engine returns a response indicating that the element library was successfully updated.<br><br>4. MSS Services returns a response indicating that the element library was successfully updated. |
| Alternate Flows | File transfer fails<br><br>1. MSS Services informs the calling component that the update failed due to 'failed file transfer'.<br><br>Update failed<br><br>3. The MSS Engine returns a response indicating that the element library failed to update.<br><br>4. MSS Services returns a response indicating that the element library failed to update. |

FIGURE 15A

| Assumptions | None. |
|---|---|
| Exceptions | None. |
| Variations | None. |
| Notes and Issues | None. |

FIGURE 15B

| | |
|---|---|
| Description | Uninstall an Element Library from an MSS Engine.<br><br>Often hardware devices are 'end of life' or a data center no longer has ownership of a specific device. The MSS Engine allows for element libraries to be uninstalled. |
| Actors | MSS Services |
| Pre-Conditions | MSS Services has successfully discovered some MSS Engine(s) on the network and the MSS Engine is currently collecting. |
| Post-Conditions | <u>Success end condition</u><br><br>MSS Services returns a response indicating that the element library was successfully uninstalled.<br><br><u>Failure end condition</u><br><br>MSS Services returns a response indicating that the element library failed to uninstall.<br><br>OR<br><br>MSS Services returns a response indicating that uninstall failed due to 'failed file transfer'.<br><br><u>Minimal Guarantee</u><br><br>MSS Services returns a response indicating success or failure. |
| Trigger | A request is received indicating that an element library should be uninstalled. |
| Main Flow | 1. MSS Services sends a request to the MSS Engine that an element library should be uninstalled.<br><br>2. The MSS Engine returns a response indicating that the element library was successfully uninstalled.<br><br>3. MSS Services returns a response indicating that the element library was successfully uninstalled. |
| Alternate Flows | Uninstall failed<br><br>2. The MSS Engine returns a response indicating that the element library failed to uninstall.<br><br>3. MSS Services returns a response indicating that the element library failed to uninstall. |
| Assumptions | None. |
| Exceptions | None. |
| Variations | None. |
| Notes and Issues | None. |

FIGURE 16

| | |
|---|---|
| Description | Aggregate data points from MSS Engines On-Demand<br><br>MSS Services provides the ability to aggregate data points coming from MSS Engines (e.g., compute total power for all racks in the data center. Racks are managed by several MSS Engines) based on rules. |
| Actors | MSS Services |
| Pre-Conditions | MSS Services has successfully discovered some MSS Engine(s) on the network.<br><br>Each MSS Engine is collecting data points from managed elements. |
| Post-Conditions | Success end condition<br><br>MSS Services has successfully aggregated data points from MSS Engines.<br><br>Failure end condition<br><br>MSS Services has not aggregated collected data points from MSS Engines.<br><br>Minimal Guarantee<br><br>The minimal guarantee is the same as the success end condition. |
| Trigger | MSS Services receives a request to aggregate data points for managed elements or containers based on rules. |
| Main Flow | 1. MSS Services retrieves the aggregation rules from the DCIM Data Store.<br>2. MSS Services gathers data points from MSS Engines associated with managed elements or containers.<br>3. MSS Services aggregates data points from MSS Engines.<br>4. MSS Services stores aggregate data points in the DCIM Data Store. |
| Alternate Flows | None. |
| Assumptions | None. |
| Exceptions | None. |
| Variations | None. |
| Notes and Issues | None. |

FIGURE 17

| | |
|---|---|
| Description | Retrieve status of an MSS Engine<br><br>MSS Services requests the current status of an MSS Engine.<br><br>The status information can include but not limited to:<br><br>• The status information of all *managed equipment* defined within the *MSS Engines*, including *device definitions* and protocols.<br>• Status information updates of *MSS Engine* components.<br>• The status information of the *MSS Engine* server such as: CPU usage, Memory Sizes, IP address, MAC address and version. |
| Actors | MSS Services |
| Pre-Conditions | None. |
| Post-Conditions | Success end condition<br><br>MSS Services returns the current status information to the calling component.<br><br>Failure end condition<br><br>MSS Services returns a response to the calling component indicating that the request failed.<br><br>Minimal Guarantee<br><br>A response will be returned indicating either success or failure. |
| Trigger | A request is made for the current status of an MSS Engine |
| Main Flow | 1. MSS Services requests the current status information from an MSS Engine.<br>2. MSS Services receives the current status information from the MSS Engine.<br>3. MSS Services returns the current status information to the calling component. |
| Alternate Flows | Failed request<br><br>1. MSS Services receives a response from the MSS Engine indicating that the request for current status failed and the reason for the failure.<br>2. MSS Services generates an audit-log indicating the failed request.<br>3. MSS Services returns a response to the calling component indicating that the request failed and the reason for the failure. |
| Assumptions | None. |
| Exceptions | None. |
| Variations | None. |
| Notes and Issues | None. |

FIGURE 18

| | |
|---|---|
| Description | Retrieve MSS Engine statistical information |
| | MSS Services retrieves the statistical information for a specific MSS Engine. |
| | The statistical information can include but not limited to: |
| | • The available space and current size of the database storing data points and configuration information. |
| | • The statistical information of all managed equipment defined within the MSS Engine, including device definitions and protocols. |
| Actors | Scheduler, MSS Engine |
| Pre-Conditions | MSS Services has successfully discovered some MSS Engine(s) on the network. |
| | MSS Services has been configured to retrieve statistical information about MSS Engine(s). |
| Post-Conditions | Success end condition |
| | MSS Services stores statistical information about an MSS Engine locally. |
| | Failure end condition |
| | MSS Services generates an audit-log indicating the failed request. |
| | MSS Services does not store statistical information about an MSS Engine locally. |
| | Minimal Guarantee |
| | A response will be returned indicating either success or failure. |
| Trigger | Scheduler informs MSS Services that it is time to request statistical information from an MSS Engine. |
| Main Flow | 1. MSS Services requests statistical information from an MSS Engine. |
| | 2. MSS Services receives a response containing statistical information. |
| | 3. MSS Services determines if the MSS Engine is 'overloaded'. |
| | 4. If the MSS Engine is 'overloaded', MSS Services sends an event indicating that the MSS Engine is overloaded. (This event may trigger a human workflow to manually load balance the collection on MSS Engines) |
| | 5. MSS Services stores the statistical information locally. |
| Alternate Flows | Failed request |
| | 2. MSS Services receives a response indicating that the request for statistical information failed and the reason for the failure. |
| | 3. MSS Services generates an audit-log indicating the failure. |
| Assumptions | None. |
| Exceptions | None. |
| Variations | None. |
| Notes and Issues | None. |

FIGURE 19

| | |
|---|---|
| Description | Send data point changes to data point subscriber<br><br>A data point subscriber (e.g., a application) registers with MSS Services to receive data points only when a data point value changes in the MSS TSD. |
| Actors | MSS Services, MSS TSD |
| Pre-Conditions | The managed element has been previously discovered by MSS Engine.<br><br>The MSS Engine is able to communicate with the managed element.<br><br>The MSS Engine is collecting data points (e.g., voltage) from a managed element at a time interval on a periodic basis (e.g., every 5 minutes) and sending these data points to the MSS TSD. |
| Post-Conditions | Success end condition<br><br>The MSS Services sends data points to applications when data point value changes.<br><br>Failure end condition<br><br>The MSS TSD does not receive the data points from MSS Engine.<br><br>Minimal Guarantee<br><br>The MSS services retrieve data points from MSS TSD. |
| Trigger | The MSS Services receives a request to subscribe for data point changes in the MSS TSD. |
| Main Flow | 1. The MSS Services registers with the MSS TSD to be notified when the data point value has changed.<br><br>2. When the data point changes, the MSS TSD notifies the MSS Services on the data point change of value.<br><br>3. The MSS Services receives the updated data point value and sends it to the data point subscriber. |
| Alternate Flows | If the MSS Services receives a request to un-subscribe for data point changes in the MSS TSD,<br><br>1. The MSS Services stops sending data points to the data point subscriber. |
| Assumptions | The MSS TSD stores numeric data points. |
| Exceptions | None. |
| Variations | None. |
| Notes and Issues | None. |

FIGURE 20

| | |
|---|---|
| Description | Update configuration |
| | MSS Services will provide public interfaces that allow the MSS UI to update configuration (e.g., create, read, update and delete) for the MSS Engine, MSS Services, and MSS TSD. |
| Actors | MSS UI, MSS Services |
| Pre-Conditions | The MSS Services communicates with MSS Engine. |
| Post-Conditions | Success end condition |
| | MSS Services updates configuration in the DCIM Data store, MSS Engine Data Store, or both. |
| | Failure end condition |
| | MSS Services is unable to update configuration in the DCIM Data Store or MSS Engine Data Store. |
| | Minimal Guarantee |
| | The configuration update succeeds or fails. |
| Trigger | The MSS Services receives a request from the MSS UI to update configuration (e.g., create, read, update and delete) for an MSS Engine. |
| Main Flow | 1. MSS Services updates configuration in the DCIM Data Store.<br>2. MSS Services finds the MSS Engine for which the configuration update has been requested.<br>3. MSS Services updates the configuration in the MSS Engine Data Store.<br>4. MSS Services logs an event for the configuration update. |
| Alternate Flows | In Step 1 of main flow, if the configuration update is for MSS Services or MSS TSD<br>2. MSS Services updates configuration in the DCIM Data Store.<br>3. MSS Services logs an event for the configuration update.<br>In Step 1 of main flow, if the configuration update fails<br>2. MSS Services logs an event to indicate the configuration update has failed.<br>3. MSS Services informs the MSS or external application that the configuration update was not successful. |
| Assumptions | None. |
| Exceptions | None. |
| Variations | None. |
| Notes and Issues | None. |

FIGURE 21

| | |
|---|---|
| Description | Store data points<br><br>The MSS TSD receives collected data points from MSS Engines and stores the data points into the TSD data store. |
| Actors | MSS Engine |
| Pre-Conditions | The MSS Engine is communicating with the MSS TSD.<br><br>Each MSS Engine collects data points and sends them to MSS TSD. |
| Post-Conditions | <u>Success end condition</u><br><br>The MSS TSD receives the data points from the MSS Engines and stores them into the MSS TSD Data Store.<br><br><u>Failure end condition</u><br><br>The MSS TSD misses data points from MSS Engines.<br><br><u>Minimal Guarantee</u><br><br>The MSS TSD stores received data points into the MSS TSD Data Store. |
| Trigger | MSS Engines send data points (e.g., temperature) to the MSS TSD. |
| Main Flow | 1. The MSS TSD receives the data points from MSS Engines.<br>2. The MSS TSD stores the data points into a temporary local data store.<br>3. The MSS TSD sends the data points to the MSS TSD Data Store. |
| Alternate Flows | In Step 3 of main flow, if MSS TSD losses its connection with the MSS TSD Data Store:<br><br>4. The MSS TSD sends an event to the MSS Services indicating that there was a loss of connection with the MSS TSD Data Store.<br>5. The MSS TSD continues to receive data points from MSS Engines.<br>6. The MSS TSD stores the data points into a temporary local data store.<br>7. When connection to the *MSS TSD Data Store* has been re-established, the data points in the temporary local data store are sent to the MSS TSD Data Store. |
| Assumptions | 1. MSS Engines sends data points to the MSS TSD.<br>2. MSS Engines send numeric data points. |
| Exceptions | None. |
| Variations | None. |
| Notes and Issues | None. |

FIGURE 22

| | |
|---|---|
| Description | The MSS TSD periodically summarizes data points to the minimal, maximum, and average values for a specific time period (e.g., daily, weekly, monthly, quarterly, and yearly) and stores them into the MSS TSD Data Store. |
| Actors | MSS TSD |
| Pre-Conditions | The MSS TSD receives collected data points from the MSS Engines. The MSS Services has collected data points for at least one time period (e.g., 1 day, 1 week). |
| Post-Conditions | Success end condition<br><br>The MSS TSD has periodically stored the minimal, maximum, and average values of the data points within the data store.<br><br>Failure end condition<br><br>N/A<br><br>Minimal Guarantee<br><br>The minimal guarantee is the same as the success end condition. |
| Trigger | The MSS TSD receives a request to summarize collected data points for a specific time period (e.g., 1 day, 1 week). |
| Main Flow | 1. The MSS TSD gathers collected data points for the specific time period.<br>2. The MSS TSD computes the data point summary (e.g., minimum, maximum, and average values) for the time period.<br>3. The MSS TSD stores the data point summary values for the time period into the MSS TSD Data Store. |
| Alternate Flows | In Step 1 of main flow, if MSS TSD losses its connection with the MSS TSD Data Store:<br><br>2. The MSS TSD sends an event to the MSS Services indicating that there was a loss of connection with the MSS TSD Data Store. |
| Assumptions | The MSS TSD has collected data points for some period of time (e.g., days, weeks)<br><br>All data points consist of numeric data. |
| Exceptions | None. |
| Variations | None. |
| Notes and Issues | None. |

FIGURE 23

| | |
|---|---|
| Description | The MSS TSD stores all data points in a data store that is accessible to other components through a JDBC or ODBC connection. |
| Actors | MSS Services |
| Pre-Conditions | The MSS TSD contains data points within the data store. |
| Post-Conditions | Success end condition<br><br>The MSS Services queries the *MSS TSD Data Store* and retrieves the data points needed to fulfil the query.<br><br>Failure end condition<br><br>The MSS Services queries for valid data points within the *MSS TSD Data Store* but unable to retrieve data points.<br><br>Minimal Guarantee<br><br>The minimal guarantee is that all data points within the *MSS TSD Data Store* will be accessible. |
| Trigger | The MSS Services queries the *MSS TSD Data Store* tables directly or access the TSD API functions to query the data store. |
| Main Flow | 1. MSS Services access the *MSS TSD Data Store* through a JDBC or ODBC connection.<br><br>2. MSS Services queries the *MSS TSD Data Store* tables directly to retrieve data points.<br><br>3. The *MSS TSD Data Store* returns the data that is queried for by the MSS Services. |
| Alternate Flows | In Step 2 of main flow, if MSS Services uses the MSS TSD API functions:<br><br>3. The MSS Services queries a set of predefined MSS TSD API functions (e.g., get latest data) to retrieve data point information.<br><br>4. The *MSS TSD Data Store* returns the data that is queried for by the MSS Services. |
| Assumptions | 1. The MSS Services uses a JDBC or ODBC connection to access MSS TSD Data Store.<br><br>2. The MSS Service contains knowledge of the MSS TSD schema or MSS TSD API functions.<br><br>3. The MSS TSD contains data points in the data store. |
| Exceptions | None. |
| Variations | None. |
| Notes and Issues | None. |

FIGURE 24

| | |
|---|---|
| Description | The MSS TSD stores all data points in a data store that is accessible to other components through a data point query interface. |
| Actors | MSS Services, MSS TSD |
| Pre-Conditions | The MSS TSD contains data points within the data store. |
| Post-Conditions | <u>Success end condition</u><br><br>The MSS Services queries the MSS TSD data point query interface and retrieves the data points needed to fulfil the query.<br><br><u>Failure end condition</u><br><br>The MSS Services queries for valid data points through the MSS TSD data point query interface but unable to retrieve data points.<br><br><u>Minimal Guarantee</u><br><br>The minimal guarantee is that there will be a response for every query to the data point query interface. |
| Trigger | The MSS Services sends a request to retrieve data points using the MSS TSD data point query interface. |
| Main Flow | 1. The MSS TSD returns data points from the MSS Data Store and in-memory data points that are queried for by the MSS Services.<br><br>2. The MSS Services receives data points from MSS TSD. |
| Alternate Flows | In Step 1 of main flow, if MSS Services sends a invalid request:<br><br>2. The MSS TSD returns an invalid query response to the MSS Services. |
| Assumptions | 1. The MSS Service contains knowledge of the MSS TSD data point query interface.<br><br>2. The MSS TSD contains data points in the MSS TSD Data Store. |
| Exceptions | None. |
| Variations | None. |
| Notes and Issues | None. |

FIGURE 25

| | |
|---|---|
| Description | The MSS TSD stores all MSS TSD configurations within the data store that is accessible to other components through a MSS TSD configuration interface. |
| Actors | MSS Services |
| Pre-Conditions | The MSS TSD contains a default MSS TSD configuration within the data store. |
| Post-Conditions | Success end condition<br>The MSS TSD stores MSS TSD configuration in the MSS TSD Data Store.<br>Failure end condition<br>The MSS TSD sends an unsuccessful response to the MSS Services if the MSS TSD configuration is not stored in the MSS TSD Data Store.<br>Minimal Guarantee<br>The minimal guarantee is that there will be a response for every request to the configuration interface. |
| Trigger | The MSS Services sends a request to the MSS TSD to store MSS TSD configuration into the MSS TSD Data Store. |
| Main Flow | 1. The MSS TSD uses the MSS TSD configuration interface to store the MSS TSD configuration into the MSS TSD Data Store.<br>2. The MSS TSD configuration interface returns a successful response to the MSS Services. |
| Alternate Flows | In Step 1 of main flow, if MSS TSD is unable to store the MSS TSD configuration into the MSS TSD Data Store:<br>2. The MSS TSD returns an unsuccessful response to the MSS Services. |
| Assumptions | 1. The MSS Service contains knowledge of the MSS TSD configuration interface. |
| Exceptions | None. |
| Variations | None. |
| Notes and Issues | None. |

FIGURE 26

| | |
|---|---|
| Description | Auto discover managed elements |
| | The MSS Engine periodically scans the network for new managed elements using discovery configuration. |
| | The MSS Engine provides the capability to discover IT infrastructure, critical infrastructure managed elements, devices managed by BMS (Building Management System) and managed element supported by Programmable Logic Controller vendors. Please refer to the Product Line Requirement document for the list of supported managed elements. |
| | - IT Infrastructure managed elements include power devices (e.g., PDUs) and servers.
- Critical infrastructure managed elements include facility equipment devices (e.g. generators, batteries and environmental devices)
- Building Management System vendors. |
| | The MSS Engine provides the capability to discover managed elements on the network by |
| | - List of IPv4 and IPv6 Address
- Subnet mask
- Gateway
- Range of IPv4 address
- List of ports
- SNMP configuration |
| Actors | MSS Engine |
| Pre-Conditions | Auto discovery configuration exists in the *MSS Engine Data Store*.
Auto discovery is scheduled to run at a given interval. |
| Post-Conditions | <u>Success end condition</u>
The MSS Engine discovers managed elements on the network
<u>Failure end condition</u>
None.
<u>Minimal Guarantee</u>
The MSS Engine logs event after auto discovery is completed. |
| Trigger | MSS Engine is scheduled to run based on auto discovery configuration |
| Main Flow | 1. The MSS Engine retrieves auto discovery configuration from the *MSS Engine Data Store*.
2. The MSS engine executes a background process to scan the network for active managed elements using auto discovery configuration.
3. The MSS Engine discovers managed elements along with topology information. |

FIGURE 27A

|  | 4. The MSS Engine stores discovered managed elements and topology into the *MSS Engine Data Store*. |
|  | 5. The MSS Engine logs an event after the auto discovery process has been completed. |
| Alternate Flows | None. |
| Assumptions | None. |
| Exceptions | None. |
| Variations | None. |
| Notes and Issues | For auto configuration updates, refer to Figure 21. |

FIGURE 27B

| | |
|---|---|
| Description | Auto discover unmanaged elements.<br><br>The MSS Engine provides capability to execute auto discovery for an unmanaged element (e.g., a device that is not known to the MSS Engine) when an unsolicited message is received by MSS Engine. |
| Actors | MSS Engine, Managed Element |
| Pre-Conditions | The unsolicited message from unmanaged element contains required information such as IP Address and port for managed element.<br><br>Auto discovery configuration exists in the *MSS Engine Data Store*.<br><br>Auto discovery is scheduled to run at a given interval. |
| Post-Conditions | Success end condition<br><br>An unmanaged element is discovered by the MSS Engine and stored into *MSS Engine Data Store*.<br><br>Failure end condition<br><br>The managed element is not discovered.<br><br>Minimal Guarantee<br>• The MSS Engine logs an event to indicate success or failure of discovery of unmanaged element.<br>• The MSS Engine stores unsolicited message as an event into the *MSS Engine Data Store*. |
| Trigger | An unsolicited message is received by the MSS Engine for an unmanaged element. |
| Main Flow | 1. The MSS Engine executes auto discovery for unmanaged element based on information available in the message.<br>2. The MSS Engine discovers unmanaged element and its topology information<br>3. The MSS Engine stores discovered unmanaged element and its topology into the *MSS Engine Data Store*.<br>4. The MSS Engine generates an event to indicate that the unmanaged element has been discovered. |
| Alternate Flows | In Step 2 of the main flow, the MSS Engine could not discover unmanaged element<br><br>3. The MSS Engine generates an event indicating that the unmanaged element has not been discovered. |
| Assumptions | None. |
| Exceptions | None. |
| Variations | None. |
| Notes and Issues | For auto configuration updates, refer to Figure 21. |

FIGURE 28

| | |
|---|---|
| Description | Discover manually added managed elements<br><br>The MSS Engine performs auto discovery of managed element(s) added by applications. |
| Actors | MSS Engine, MSS Services |
| Pre-Conditions | Manually added managed element exists in the *MSS Engine Data Store*.<br><br>The IP address and protocols associated with the managed elements exist in the *MSS Engine Data Store*. |
| Post-Conditions | Success end condition<br>The topology for managed element is stored in the *MSS Engine Data Store*.<br>Failure end condition<br>None.<br>Minimal Guarantee<br>The MSS Engine generates a success or failure event. |
| Trigger | The MSS Engine generates an event for a manually added managed element to the MSS Engine Data Store. |
| Main Flow | 1. The MSS Engine performs discovery for the manually added managed element using the information (e.g., IP address) contained in the event.<br><br>2. The MSS Engine stores discovered managed element into the *MSS Engine Data Store*.<br><br>3. The MSS Engine discovers managed element along with topology information.<br><br>4. The MSS Engine generates an event to indicate that a managed element has been discovered. |
| Alternate Flows | None. |
| Assumptions | None. |
| Exceptions | None. |
| Variations | None. |
| Notes and Issues | None. |

FIGURE 29

| | |
|---|---|
| Description | Collect data points based on time interval<br><br>The MSS Engine collects data points associated with a managed element based on a time interval (e.g., monitor power usage for a server every 30 minutes). |
| Actors | MSS Engine |
| Pre-Conditions | The managed element has been previously discovered by the MSS Engine.<br><br>The MSS Engine is communicating with the managed element.<br><br>The managed element is configured for data point collection in the MSS Engine.<br><br>The MSS Engine has a configured rule to collect data points from a managed element based on a time interval.<br><br>The MSS Engine has a configured set of data points to collect from the managed element.<br><br>The MSS Engine has a background task that collects data points from the managed element based on the configured time interval. |
| Post-Conditions | <u>Success end condition</u><br>The MSS TSD receives data points based on the configured collection time interval.<br><u>Failure end condition</u><br>None.<br><u>Minimal Guarantee</u><br>The minimal guarantee is the same as the success end condition. |
| Trigger | The MSS Engine executes the background task to collect data points from a managed element for a specific time interval. |
| Main Flow | 1. The MSS Engine collects data points from the managed element during the configured time interval.<br><br>2. The MSS Engine stores collected change of value (CoV) data points into a temporary local data store. |
| Alternate Flows | In Step 1 of main flow, if MSS Engine losses its connection with the managed element,<br><br>2. The MSS Engine sends an event to the MSS Services indicating that there was a loss of connection with the managed element.<br><br>3. If the MSS Engine establishes communication with the managed element, the MSS Engine continues to collect data points during the configured time interval.<br><br>4. The MSS Engine continues to store collected data points into a temporary local data store. |

FIGURE 30A

| Assumptions | |
|---|---|
| | 1. The MSS Engine collects numeric data points. |
| | 2. The default collection time interval is 5 minutes |
| | 3. The minimum collection time interval is 1 minute. |
| | 4. The maximum collection time interval is 1 day. |
| Exceptions | None. |
| Variations | None. |
| Notes and Issues | For configuration of data point collection rules (e.g., collect data points from a managed element based on a time interval), refer to Figure 21. |

FIGURE 30B

| | |
|---|---|
| Description | Collect environment data points from *Appliance*<br><br>The MSS Engine collects environment data points from *Appliance*. |
| Actors | MSS Engine |
| Pre-Conditions | The MSS Engine is communicating with the *Appliance*.<br><br>The *Appliance* has been configured to always send environment data points to the MSS Engine.<br><br>The MSS Engine is collecting data points, including environment data points, from *Appliance* based on configured collection rules. |
| Post-Conditions | Success end condition<br><br>The MSS Services receives environment data points from *Appliance*.<br><br>Failure end condition<br><br>None.<br><br>Minimal Guarantee<br><br>The minimal guarantee is the same as the success end condition. |
| Trigger | The MSS Engine executes a background task to collect environment data points from the *Appliance*. |
| Main Flow | 1. The MSS Engine collects environment data points from the *Appliance*.<br>2. The MSS Engine sends collected environment data points to MSS TSD. |
| Alternate Flows | None. |
| Assumptions | The MSS Engine collects numeric data points. |
| Exceptions | None. |
| Variations | The MSS Engine collects environment data points from *Appliance* based on a configured time interval. Please refer to the following use case:<br><br>UC-ENG-AUTO-COLL-01 Collect Data Points based On Time Interval |
| Notes and Issues | For configuration of data point collection rules (e.g., collect data points from a managed element based on a time interval), refer to Figure 21. |

FIGURE 31

| | |
|---|---|
| Description | Compute data points based on business logic rules |
| | The MSS Engine computes new data points from collected data points based on business logic rules. An example of this is when a managed element does not report a specific data point (e.g., energy consumption). The MSS Engine performs the computation based on the collected data points. |
| Actors | MSS Engine, MSS Services |
| Pre-Conditions | The managed element has been previously discovered by the MSS Engine. |
| | The MSS Engine is communicating with the managed element. |
| | The MSS Engine has a rule to compute new data points based on collected data points. |
| Post-Conditions | Success end condition |
| | The MSS Engine performs computation based on collected data points. |
| | Failure end condition |
| | The MSS Engine does not get data points to perform computation. |
| | Minimal Guarantee |
| | The minimal guarantee is the same as the success end condition. |
| Trigger | The MSS Engine runs a background process to collect data points based on a time interval. |
| Main Flow | 1. The MSS Engine determines that a collection rule is needed to perform a computation based on collected data points. |
| | 2. The MSS Engine executes the collection rule and performs the computation based on the collected data points. |
| | 3. The MSS Engine sends the computed value to the MSS TSD. |
| Alternate Flows | None. |
| Assumptions | The MSS Engine collects numeric data points. |
| Exceptions | None. |
| Variations | None. |
| Notes and Issues | None. |

FIGURE 32

| | |
|---|---|
| Description | Collect data points on-demand<br><br>The MSS Services collects data points for a managed element on-demand (e.g., at the current time). |
| Actors | MSS Services, MSS Engine |
| Pre-Conditions | The managed element has been previously discovered by the MSS Engine.<br><br>The MSS Engine is able to communicate with the managed element. |
| Post-Conditions | <u>Success end condition</u><br><br>The MSS Services receives the data points from managed element.<br><br><u>Failure end condition</u><br><br>The MSS Services does not receive the data points from managed element<br><br><u>Minimal Guarantee</u><br><br>The minimal guarantee is the same as the success end condition. |
| Trigger | The MSS Services requests to collect data points (e.g., temperature) on-demand from a managed element. |
| Main Flow | 1. The MSS Services forwards the request to the MSS Engine.<br>2. The MSS Engine collects the data points from the managed element.<br>3. The MSS Engine sends the data points to the MSS Services. |
| Alternate Flows | None. |
| Assumptions | The MSS Engine collects numeric data points. |
| Exceptions | None. |
| Variations | None. |
| Notes and Issues | None. |

FIGURE 33

| | |
|---|---|
| Description | Collect data points based on events |
| | The MSS Services collects data points from a managed element based on an event (e.g., user opened door) at a configured time interval on a periodic basis. |
| Actors | MSS Services, MSS Engine |
| Pre-Conditions | The managed element has been previously discovered by MSS Engine. |
| | The MSS Engine is able to communicate with the managed element. |
| | The MSS Engine has a configured a rule to collect data points (e.g., humidity) from a managed element at a time interval on a periodic basis (e.g., every 20 seconds) when a specific event occurs. |
| Post-Conditions | Success end condition |
| | The MSS Services receives the data points from managed element at a configured time interval on a periodic basis. |
| | Failure end condition |
| | The MSS Services does not receive the data points from managed element. |
| | Minimal Guarantee |
| | The minimal guarantee is the same as the success end condition. |
| Trigger | The MSS Services subscribes with the MSS Engine to receive data points from a managed element at a configured time interval on a periodic basis. |
| Main Flow | The MSS Engine performs the following actions at each time interval, <br> 1. The MSS Engine collects data points from managed element. <br> 2. The MSS Engine sends collected data points to the MSS Services. |
| Alternate Flows | |
| Assumptions | The MSS Engine collects numeric data points. |
| Exceptions | None. |
| Variations | None. |
| Notes and Issues | None. |

FIGURE 34

| | |
|---|---|
| Description | Aggregate Data Points Based on Mathematical Rules |
| | The MSS Engine provides the ability to aggregate data points based on mathematical rules. |
| Actors | MSS Engine |
| Pre-Conditions | The MSS Engine has discovered devices on the network. |
| | The MSS Engine is collecting data points from managed elements. |
| | The MSS Engine Data Store contains a set of mathematical rules to aggregate collected data points. |
| Post-Conditions | Success end condition |
| | Aggregated data points are generated based on the mathematical rules that are applied to collected data points. The new data points are sent to the MSS TSD. |
| | Failure end condition |
| | Data points are not aggregated during data point collection. |
| | Minimal Guarantee |
| | The MSS Engine applies the mathematical rule on collected data points. |
| Trigger | Data points are collected by the MSS Engine. |
| Main Flow | 4. The MSS Engine retrieves the mathematical rule for data point aggregation from the *MSS Engine Data Store*. |
| | 5. The MSS Engine executes the mathematical rule on collected data points and creates new aggregated data points. |
| | 6. The MSS Engine sends the aggregated data points to the MSS TSD. |
| Alternate Flows | None. |
| Assumptions | None. |
| Exceptions | None. |
| Variations | None. |
| Notes and Issues | For configuration of data point aggregation rules, refer to Figure 21. |

FIGURE 35

| Description | When the MSS Engine receives an event from a managed element, the event is created and sent to the MSS Services. |
|---|---|
| Actors | MSS Engine, MSS Services |
| Pre-Conditions | The MSS Engine has configured export rule to indicate when events are exported to MSS Services.<br><br>The MSS Engine has a background process that exports events to MSS Services on a periodic basis. |
| Post-Conditions | Success end condition<br><br>The MSS Engine exports events to MSS Services successfully.<br><br>Failure end condition<br><br>The MSS Engine is unable to export events to MSS Services.<br><br>Minimal Guarantee<br><br>Any events that failed to be exported will be retried in the next export cycle. |
| Trigger | The MSS Engine is ready to export events to MSS Services. |
| Main Flow | 1. The MSS Engine collects all events that have not been exported to MSS Services.<br><br>2. The MSS Engine filters out all events that have been configured as 'disabled'.<br><br>3. The MSS Engine sends events to MSS Services.<br><br>4. The MSS Engine removes events from *MSS Engine Data Store* based on event retention rules. |
| Alternate Flows | None. |
| Assumptions | None. |
| Exceptions | None. |
| Variations | None. |
| Notes and Issues | For configuration of event rules and event filtering, refer to Figure 21. |

FIGURE 36

| | |
|---|---|
| Description | Transform events into MSS Engine events |
| | When the MSS Engine receives events from managed elements (via SNMP trap) the MSS Engine translates the event data into MSS Engine events. |
| Actors | MSS Engine |
| Pre-Conditions | The MSS Engine has successfully discovered managed elements. |
| Post-Conditions | <u>Success end condition</u><br><br>The received event is transformed into an MSS Engine event.<br><br><u>Failure end condition</u><br><br>The received event is not properly translated.<br><br><u>Minimal Guarantee</u><br><br>The MSS Engine creates an entry for the received event in the trace log. |
| Trigger | An event is received by the MSS Engine |
| Main Flow | 1. The MSS Engine accepts the event<br>2. The MSS Engine translates the event into one of many MSS Engine events. |
| Alternate Flows | In Step 1 of main flow, if the translation fails<br><br>3. The MSS Engine logs the failure.<br>4. The MSS Engine drops the event. |
| Assumptions | None. |
| Exceptions | None. |
| Variations | None. |
| Notes and Issues | None. |

FIGURE 37

| | |
|---|---|
| Description | Handle Events from Unmanaged Elements<br><br>The MSS Engine handles events from unmanaged elements that communicate with the MSS Engine. These events must contain information about the device that generated the event (e.g., IP address, Mac address ...). |
| Actors | MSS Engine |
| Pre-Conditions | None. |
| Post-Conditions | <u>Success end condition</u><br><br>The MSS Engine sends event to MSS Services.<br><br><u>Failure end condition</u><br><br>The MSS Engine does not send event to MSS Services.<br><br><u>Minimal Guarantee</u><br><br>The minimal guarantee is that each event that follows the MSS Engine event format and provides correct event information will be process by the MSS Engine. |
| Trigger | An unmanaged element on the network sends an event to the MSS Engine. |
| Main Flow | 1. The MSS Engine processes the event and extracts information from the event.<br><br>2. The MSS Engine transforms the event into an MSS Event.<br><br>3. The MSS Engine extracts device information from the event and stores it into the *MSS Engine Data Store*.<br><br>4. The MSS Engine sends the event to MSS Services. |
| Alternate Flows | In Step 2 of main flow, if MSS Engine receives an event from a known device:<br><br>3. The MSS Engine stores the event within the *MSS Engine Data Store*.<br><br>4. The MSS Engine sends the event to MSS Services. |
| Assumptions | The known devices sending events to the MSS Engine are aware of the event format needed for the MSS Engine to accept the event. |
| Exceptions | None. |
| Variations | None. |
| Notes and Issues | For the transformation of events into MSS Engine events, refer to Figure 37. |

FIGURE 38

| | |
|---|---|
| Description | Handle Unknown Events<br><br>When an event is received from a managed element and the *event* is not recognized in the set of known configured event, an unknown *event* will be generated. |
| Actors | MSS Engine |
| Pre-Conditions | All known events have been configured. |
| Post-Conditions | Success end condition<br><br>The event is stored in the *MSS Engine Data Store*.<br><br>Failure end condition<br><br>The event is not stored in the *MSS Engine Data Store* and the event is not sent to the analysed by the MSS Engine.<br><br>Minimal Guarantee<br><br>Every event will be examined to determine if the Event is of an event-type has been configured. If the event is of an event-type that has been configured it is guaranteed that the event if of a 'known' type. |
| Trigger | An unknown event is sent to the MSS Engine |
| Main Flow | 1. The MSS Engine receives the event.<br><br>2. The MSS Engine queries the *MSS Engine Data Store* for a type of event that matches the received event.<br><br>3. If the event is not found, the event is considered 'unknown'. The MSS Engine stores the unknown event in the *MSS Engine Data Store*.<br><br>4. The MSS Engine sends the event to MSS Services. |
| Alternate Flows | None. |
| Assumptions | The received event has a property specifying the type of event. |
| Exceptions | None. |
| Variations | None. |
| Notes and Issues | None. |

FIGURE 39

| | |
|---|---|
| Description | Consolidate events |
| | The MSS Engine consolidates events (i.e., combines events into a single event) |
| Actors | MSS Engine |
| Pre-Conditions | The MSS Engine is operating and receiving events on the network and is communicating with the MSS Services. |
| | The MSS Engine has a configured set of rules to consolidate events. |
| Post-Conditions | <u>Success end condition</u> |
| | The MSS Engine creates a single event from multiple events. |
| | <u>Failure end condition</u> |
| | The MSS Engine does not receive the consolidated event. |
| | <u>Minimal Guarantee</u> |
| | The minimal guarantee is the same as the success end condition. |
| Trigger | The MSS Engine receives multiple events |
| Main Flow | 1. The MSS Engine retrieves rules for consolidating events from the MSS Engine Data Store.<br><br>2. The MSS Engine applies event consolidation rules and creates a single event.<br><br>3. The MSS Engine sends consolidated event to MSS Services. |
| Alternate Flows | None. |
| Assumptions | None. |
| Exceptions | None. |
| Variations | None. |
| Notes and Issues | For configuration of event consolidation rules, refer to Figure 21. |

FIGURE 40

| | |
|---|---|
| Description | Filter disabled events<br><br>When the MSS Engine receives an *event* of a type that has been disabled, the MSS Engine will ignore the *event*. |
| Actors | Managed Elements |
| Pre-Conditions | All known events have been configured and marked as either 'disabled' or 'enabled'. |
| Post-Conditions | Success end condition<br><br>The event is either processed or not processed based on whether or not the event has been configured as a disabled event or not.<br><br>Failure end condition<br><br>None.<br><br>Minimal Guarantee<br><br>Every *event* will be examined to determine if the *event* has been disabled or not. |
| Trigger | An *event* is received by the MSS Engine |
| Main Flow | 1. The MSS Engine determines the type of the *event*.<br><br>2. The MSS Engine searches the configured events in the *MSS Engine Data Store* to see if the *event* received is disabled.<br><br>3. If the *event* received is of a type that is 'disabled' the MSS Engine performs no further processing on the event. |
| Alternate Flows | Not Disabled<br><br>3. If the *event* received is not of a type that is 'disabled' the MSS Engine continues processing the event. |
| Assumptions | None. |
| Exceptions | None. |
| Variations | None. |
| Notes and Issues | For configuration of events, refer to Figure 21. |

FIGURE 41

| Description | Detect data point threshold violations |
|---|---|
| | When *data points* are received from managed elements and the *data point* is value does not fall within the configured threshold limits contained within an analysis rule associated with the managed element that generated the data point a threshold violation will be detected. |
| Actors | MSS Engine, Managed Elements |
| Pre-Conditions | The MSS Engine has a configured data point threshold rule that is associated with the managed element that generated the data point. |
| Post-Conditions | Success end condition |
| | Either a threshold violation event is generated or not. |
| | Failure end condition |
| | Minimal Guarantee |
| | All threshold violation event(s) will describe the threshold limit that was crossed ('high critical', 'high warning', 'low warning' and 'low critical'). |
| Trigger | A data point has been collected from a managed element. |
| Main Flow | 1. MSS Engine determines the source (managed element) of the data point.<br><br>2. MSS Engine retrieves the data point threshold rule associated with the managed element.<br><br>3. MSS Engine determines if the data point value is within the configured threshold limits contained within the analysis rule.<br><br>4. If MSS Engine determines that the data point value is within the configured threshold limits no events are generated and processing proceeds. |

FIGURE 42A

| | |
|---|---|
| Alternate Flows | High Critical<br><br>4. If MSS Engine determines that the data point value is greater than or equal to the configured 'high critical' threshold limit a threshold violation event is generated indicating that a 'high critical' threshold violation has occurred.<br><br>High Warning<br><br>4. If MSS Engine determines that the data point value is less than the 'high critical' threshold limit and greater than or equal to the 'high warning' threshold limit a threshold violation event is generated indicating that a 'high warning' threshold violation has occurred.<br><br>Low Warning<br><br>4. If MSS Engine determines that the data point value is less than or equal to the 'low warning' threshold limit and greater than the 'low critical' threshold limit a threshold violation event is generated indicating that a 'low warning' threshold violation has occurred.<br><br>Low Critical<br><br>4. If MSS Engine determines that the data point value is less than or equal to the 'low critical' threshold limit a threshold violation event is generated indicating that a 'low critical' threshold violation has occurred. |
| Assumptions | None. |
| Exceptions | None. |
| Variations | None. |
| Notes and Issues | For configuration of data point threshold rules, refer to Figure 21. |

FIGURE 42B

| Description | The MSS Engine executes commands from MSS user interface. |
|---|---|
| Actors | MSS Engine |
| Pre-Conditions | The MSS Engine is in operation. |
| Post-Conditions | Success end condition<br>An MSS Engine command is executed.<br>Failure end condition<br>An MSS Engine command is not executed.<br>Minimal Guarantee<br>The MSS Engine will provide a set of commands to be executed on the MSS Engine. |
| Trigger | The MSS Engine UI sends a command request to the MSS Engine. |
| Main Flow | 1. The MSS Engine validates the request is a valid command.<br>2. The MSS Engine performs the command.<br>3. The MSS Engine sends an event indicating that the command has been executed successfully. |
| Alternate Flows | In Step 2 of main flow, if MSS Engine is unable to perform the command:<br>3. The MSS Engine sends an event indicating that the command has not been performed. |
| Assumptions | None. |
| Exceptions | None. |
| Variations | None. |
| Notes and Issues | None. |

FIGURE 43

| | |
|---|---|
| Description | The MSS Engine executes commands triggered by events. |
| Actors | MSS Services, MSS Engine |
| Pre-Conditions | The MSS Engine is in operation and communicating with the devices on the network.<br><br>The MSS Engine defines a rule that indicates which command to execute when an event occurs. |
| Post-Conditions | Success end condition<br><br>The MSS Engine command is executed based on an MSS Engine event.<br><br>Failure end condition<br><br>The MSS Engine command is not executed.<br><br>Minimal Guarantee<br><br>The minimal guarantee is that the MSS Engine will provide a set of commands to be executed on the MSS Engine. |
| Trigger | The MSS Engine receives an event. |
| Main Flow | 1. The MSS Engine retrieves the rule that indicates which command to execute when the event occurs.<br><br>2. The MSS Engine executes the command.<br><br>3. The MSS Engine sends an event indicating that the command has been executed successfully. |
| Alternate Flows | In Step 2 of main flow, if MSS Engine is unable to perform the command:<br><br>3. The MSS Engine sends an event indicating that the command has not been executed. |
| Assumptions | None. |
| Exceptions | None. |
| Variations | None. |
| Notes and Issues | None. |

FIGURE 44

| | |
|---|---|
| Description | The MSS Engine will execute commands based on the result of a rule threshold. |
| Actors | MSS Engine, MSS Services |
| Pre-Conditions | The MSS Engine is in operation and contains a set of rules that activates MSS Engine commands when the rule threshold is reached. |
| Post-Conditions | Success end condition<br><br>A MSS Engine command is executed based on a rule threshold being reached.<br><br>Failure end condition<br><br>A MSS Engine command is not executed.<br><br>Minimal Guarantee<br><br>The minimal guarantee is that the MSS Engine will provide a set of commands to be executed on the MSS Engine. |
| Trigger | Data points arrive to the MSS Engine |
| Main Flow | 1. The MSS Engine validates the collected data points with the threshold rule stored on the MSS Engine.<br><br>2. The MSS Engine performs the command associated with the threshold rule.<br><br>3. The MSS Engine sends an event that the command has been executed successfully. |
| Alternate Flows | In Step 2 of main flow, if MSS Engine is unable to perform the command:<br><br>3. The MSS Engine sends an event that the command has not been performed. |
| Assumptions | 1. The MSS Service contains knowledge of the MSS Engine commands. A command is associated with the threshold rule sent to the MSS Engine from the MSS Services.<br><br>2. The MSS Services has a service to send threshold rules to the MSS Engine.<br><br>3. The MSS Engine is collecting data points for the threshold rule stored on the MSS Engine. |
| Exceptions | None. |
| Variations | None. |
| Notes and Issues | None. |

FIGURE 45

| | |
|---|---|
| Description | Synchronize containers |
| | The MSS Engine synchronizes containers in the MSS Engine Data Store with the containers stored the DCIM Data Store. A container contains managed elements and other containers. For example, a row of racks contains racks and a rack contains managed elements such as servers and PDUs. |
| Actors | MSS Services, MSS Engine |
| Pre-Conditions | The MSS Engine Data Store has at least one container with a managed element to synchronize (e.g., the container has been modified, added, or removed). |
| Post-Conditions | Success end condition |
| | The contents of a container in the DCIM Data Store are synchronized with the same container in the MSS Engine Data Store. |
| | Failure end condition |
| | N/A |
| | Minimal Guarantee |
| | The minimal guarantee is the same as the success end condition. |
| Trigger | The MSS Services receives a notification indicating that a container has been updated (e.g., managed element added or removed) in the DCIM Data Store. |
| Main Flow | 1. The MSS Services sends a request to the MSS Engine to synchronize the container in the MSS Engine Data Store. |
| | 2. The MSS Engine synchronizes the container in the MSS Engine Data Store. |
| | 3. The MSS Engine logs an event to indicate that the container has been synchronized. |
| Alternate Flows | None. |
| Assumptions | None. |
| Exceptions | None. |
| Variations | None. |
| Notes and Issues | None. |

FIGURE 46

| | |
|---|---|
| Description | Synchronize topology for discovered managed elements<br><br>The MSS Engine updates managed elements and its topology information when re-discovered by the MSS Engine. |
| Actors | MSS Engine |
| Pre-Conditions | The MSS Engine has discovered managed elements from the network. |
| Post-Conditions | <u>Success end condition</u><br><br>The MSS Engine updates topology for discovered managed elements into the MSS Engine Data Store.<br><u>Failure end condition</u><br><br>The MSS Engine could not store discovered managed elements which are already exists with same topology information.<br><u>Minimal Guarantee</u><br><br>The MSS Engine generates an event only if the topology for the discovered managed element has been updated. |
| Trigger | The MSS Engine re-discovers managed elements on the network. |
| Main Flow | 1. The MSS Engine queries existing managed elements stored in the MSS Engine Data Store.<br><br>2. The MSS Engine updates the topology for the managed element in the MSS Engine Data Store.<br><br>3. The MSS Engine generates an event to indicate that the topology for the managed element has been updated. |
| Alternate Flows | None. |
| Assumptions | None. |
| Exceptions | None. |
| Variations | None. |
| Notes and Issues | None. |

FIGURE 47

| | |
|---|---|
| Description | Synchronize managed element properties |
| | The MSS Engine synchronizes properties (e.g., server name) for managed elements in the MSS Engine Data Store with the properties stored the DCIM Data Store. |
| Actors | MSS Services, MSS Engine |
| Pre-Conditions | The DCIM Data Store has at least one managed element to synchronize. |
| Post-Conditions | Success end condition<br><br>The properties for the managed element in the MSS Engine Data Store are synchronized with the properties in the DCIM Data Store.<br><br>Failure end condition<br><br>The properties for the managed element in the MSS Engine Data Store are not synchronized with the properties in the DCIM Data Store.<br><br>Minimal Guarantee<br><br>The minimal guarantee is the same as the success end condition. |
| Trigger | The MSS Services receives a notification indicating that the properties for a managed element has been updated (e.g., added, modified, or deleted) in the DCIM Data Store. |
| Main Flow | 1. The MSS Services sends a request to the MSS Engine to synchronize the properties for the managed element in the MSS Engine Data Store.<br><br>2. The MSS Engine synchronizes the properties for the managed element in the MSS Engine Data Store.<br><br>3. The MSS Engine logs an event to indicate that the properties for the managed element that have been updated. |
| Alternate Flows | None. |
| Assumptions | None. |
| Exceptions | None. |
| Variations | None. |
| Notes and Issues | The MSS Engine synchronizes imported properties (e.g., equipment identifiers, IP address, port mapping) from Liebert SiteLink managed elements stored in the DCIM Data Store as specified in the *Facilities Operations Manager* document. |

FIGURE 48

| | |
|---|---|
| Description | Set operating state of a managed element. |
| | MSS Engine provides a capability to set the operating state of a managed element. |
| Actors | MSS Engine, MSS Services |
| Pre-Conditions | Managed element exists in MSS Engine Data Store. |
| Post-Conditions | Success end condition |
| | The operating state of the managed element has been set successfully. |
| | Failure end condition |
| | The MSS Engine is unable to set operating state of the managed element. |
| | Minimal Guarantee |
| | Returns success/failure status to MSS Services. |
| Trigger | MSS Services receives a request to set operating state of a managed element |
| Main Flow | 1. The MSS Engine finds managed element in the MSS Engine Data Store. |
| | 2. The MSS Engine saves the operating state of the managed element in the MSS Engine Data Store. |
| Alternate Flows | None. |
| Assumptions | None. |
| Exceptions | None. |
| Variations | None. |
| Notes and Issues | Examples of operating states are normal, maintenance mode, in alarm or non-responding. |

FIGURE 49

| Description | Connect to managed element using element library |
| --- | --- |
| | The MSS Engine connects to a managed element using an element library. |
| Actors | MSS Engine |
| Pre-Conditions | The MSS Engine is able to communicate with the managed element. |
| Post-Conditions | Success end condition |
| | The MSS Engine connects to the managed element using an element library. |
| | Failure end condition |
| | N/A |
| | Minimal Guarantee |
| | The minimal guarantee is the same as the success end condition. |
| Trigger | The MSS Engine receives a request from the MSS Services to discover a managed element. |
| Main Flow | 1. The MSS Engine retrieves the element library that is associated with the managed element.<br><br>2. The MSS Engine uses the element library to connect to the managed element. |
| Alternate Flows | If there is a network communication error,<br><br>1. The MSS Engine attempts to connect to the managed element at different time intervals. |
| Assumptions | None. |
| Exceptions | None. |
| Variations | None. |
| Notes and Issues | None. |

FIGURE 50

| | |
|---|---|
| Description | Collect data points using element library<br><br>The MSS Engine collects data points from a managed element using an element library. |
| Actors | MSS Engine |
| Pre-Conditions | The managed element has been previously discovered by the MSS Engine.<br><br>The MSS Engine is communicating with the managed element. |
| Post-Conditions | Success end condition<br><br>The MSS Engine collects data points from managed element using an element library.<br><br>Failure end condition<br><br>The MSS Engine does not received data points from managed element.<br><br>Minimal Guarantee<br><br>The minimal guarantee is the same as the success end condition. |
| Trigger | The MSS Engine requests to collect data points for a managed element. |
| Main Flow | 1. The MSS Engine retrieves the element library that is associated with the managed element.<br><br>2. The MSS Engine uses the element library to collect data points from the managed element.<br><br>3. The MSS Engine receives data points from the managed element. |
| Alternate Flows | If the element library associated with the managed element has been stopped,<br><br>1. The MSS Engine does not receive data points from managed element. |
| Assumptions | The MSS Engine collects numeric data points. |
| Exceptions | None. |
| Variations | None. |
| Notes and Issues | None. |

FIGURE 51

| Description | Execute commands using element library |
| --- | --- |
| | The MSS Engine executes commands on managed elements using an element library. |
| Actors | MSS Engine |
| Pre-Conditions | The managed element has been previously discovered by the MSS Engine. |
| | The MSS Engine is communicating with the managed element. |
| Post-Conditions | Success end condition |
| | The MSS Engine executes commands on managed element using an element library. |
| | Failure end condition |
| | None. |
| | Minimal Guarantee |
| | The minimal guarantee is the same as the success end condition. |
| Trigger | The MSS Engine requests to execute a command on a managed element. |
| Main Flow | 1. The MSS Engine retrieves the element library that is associated with the managed element from the MSS Engine Data Store.<br>2. The MSS Engine uses the element library to execute the command on the managed element.<br>3. The MSS Engine receives response from command execution. |
| Alternate Flows | None. |
| Assumptions | None. |
| Exceptions | None. |
| Variations | None. |
| Notes and Issues | None. |

FIGURE 52

| | |
|---|---|
| Description | Start an element library |
| | The MSS Engine receives a request from MSS Services to start an element library. |
| Actors | MSS Services, MSS Engine |
| Pre-Conditions | The element library exists in the MSS Engine. |
| Post-Conditions | Success end condition |
| | The element library starts successfully. |
| | Failure end condition |
| | The element is unable to start successfully. |
| | Minimal Guarantee |
| | The minimal guarantee is the same as the success end condition. |
| Trigger | The MSS Engine receives a request from the MSS Services to start an element library. |
| Main Flow | 1. The MSS Engine retrieves the element library from the MSS Engine Data Store.<br><br>2. The MSS Engine starts the element library.<br><br>3. The MSS Engine logs an event to indicate that the element library has been started. |
| Alternate Flows | None. |
| Assumptions | 1. An element library includes the device definition file.<br><br>2. An element library is capable of supporting multiple managed element types. |
| Exceptions | None. |
| Variations | None. |
| Notes and Issues | None. |

FIGURE 53

| | |
|---|---|
| Description | Stop an element library |
| | The MSS Engine receives a request from MSS Services to stop an element library. |
| Actors | MSS Services, MSS Engine |
| Pre-Conditions | The element library exists in the MSS Engine. |
| Post-Conditions | Success end condition |
| | The element library stops successfully. |
| | Failure end condition |
| | The element is unable to stop successfully. |
| | Minimal Guarantee |
| | The minimal guarantee is the same as the success end condition. |
| Trigger | The MSS Engine receives a request from the MSS Services to stop an element library. |
| Main Flow | 1. The MSS Engine retrieves the element library from the MSS Engine Data Store. |
| | 2. The MSS Engine stops the element library without interrupting the MSS Engine. |
| | 3. The MSS Engine logs an event to indicate that the element library has been stopped. |
| Alternate Flows | None. |
| Assumptions | 1. An element library includes the device definition file. |
| | 2. An element library is capable of supporting multiple managed element types. |
| Exceptions | None. |
| Variations | None. |
| Notes and Issues | None. |

FIGURE 54

SYSTEM AND METHOD FOR MONITORING AND MANAGING DATA CENTER RESOURCES IN REAL TIME INCORPORATING MANAGEABILITY SUBSYSTEM

TECHNICAL FIELD

The present application is directed to systems and methods for managing the infrastructure associated with data centers, and particularly to a system and method for monitoring and managing hardware and software components of a modern day data center in a manner that optimizes the efficient use of the hardware and software components, and which also allows real time reconfiguration of the infrastructure components of the data center to meet changing needs and demands.

BACKGROUND

This section provides background information related to the present disclosure which is not necessarily prior art.

The common data center model has gone through many variations since its origins in mainframe computing. As shown in FIG. 1, from distributed computers, to the client/server model, the utilization of virtualized servers, grid consolidation, and most recently the trend toward utility or "cloud" computing, the demands on data centers are always changing and evolving, and the pace of that evolution is increasing as well.

Modern data centers are undergoing a broad transformation, which encompasses technical innovation, operational improvement, new design principles, changes in the data center supply chain, and changes to the relationship between IT and business. Thus, modern data centers are forming increasingly complex environments with many variables that must be taken into account when considering methods to optimize their efficiency. Along with this transformation comes the issue of energy efficiency and resource management, which will be vital to the success and long-term sustainment of these modern data centers. Currently, there exists a gap in information between the data center infrastructure layer (power, cooling, and space) and the information technology ("IT") infrastructure layer (e.g., computing, storage and communications) which is limiting organizations in optimizing efficiency. One example of the layers that form a typical data center is shown in FIG. 2. The ability to maximize efficiency depends upon being able to collect data from all the different components associated with the data center (i.e., IT and infrastructure), and to present the information in a useful way to the system administrators which enables them to make changes when necessary. This ability has come to be referred to among current professionals as "Data Center Infrastructure Management (DCIM)".

The need for a DCIM solution has been brought to light largely by the increase in consolidation and the associated virtualization, which has exposed the aforementioned gap between the IT layer and the infrastructure layer of a modern day data center, and especially the inefficiencies that this gap creates. The gap also poses a dilemma for data center managers: should they sacrifice efficiency by leaving unused capacity (e.g., electrical power capacity or cooling capacity) as a safety net against overloading, or should they use this capacity and increase efficiency at the risk of failure? One principal goal of the present DCIM system and method is to aid the decision-making process by providing accurate and real-time information to the system administrators in a useful and meaningful way. The bridging of the IT/infrastructure gap is crucial as the demands placed on data centers continue to grow into the future. But up until the present time, no suitable solutions have been proposed which can provide sufficient information to system administrators to accomplish the needed real time management of infrastructure resources to meet the changing needs of the IT layer.

SUMMARY

In one aspect the present disclosure relates to a system for controlling a plurality of managed devices. The system may comprise a manageability services module adapted to facilitate communication between the plurality of managed devices and a central user located remotely from the plurality of managed devices. The system may also comprise a manageability engine module in communication with the manageability services module. The manageability engine module may include an element library storing parameters associated with the plurality of managed devices and being configured to: (i) facilitate communication between the plurality of managed devices and the manageability services module, (ii) discover a new managed device when the new managed device is added to the system, (iii) collect data from the plurality of managed devices, (iv) aggregate data from each of the plurality of managed devices to generate aggregated data for each of the plurality of managed devices, (v) provide the aggregated data for each of the plurality of managed devices to the central user, and (vi) provide real-time analytics on the data as it is collected from the plurality of managed devices. A database coupled to the manageability services module and the manageability engine module may also be included, and may be adapted to store the data collected by the manageability engine module from the plurality of managed devices.

In another aspect the present disclosure relates to a method for controlling a plurality of managed devices with a system including a manageability services module in communication with a manageability engine module and a database. The method may comprise arranging the manageability engine module between the plurality of managed devices and the manageability services module. The method may also include arranging the manageability services module between the manageability engine module and a central user located remotely from the plurality of managed devices, as well as facilitating communication between the plurality of managed devices and a central user located remotely from the plurality of managed devices. The method may also include discovering a new managed device when the new managed device is added to the system, and collecting, at the manageability engine module, data from the plurality of managed devices. The method may further include aggregating, at the manageability engine module, data from each of the plurality of managed devices to generate aggregated data for each of the plurality of managed devices. The method may further include providing the aggregated data for each of the plurality of managed devices to the central user, and providing, at the manageability engine module, real-time analytics on the data as it is collected from the plurality of managed devices. Still further the method may include using a database coupled to the manageability services module and the manageability engine module, where the database is adapted to store the data collected by the manageability engine module from the plurality of managed devices.

Further areas of applicability will become apparent from the description provided herein. The description and specific examples in this summary are intended for purposes of illustration only and are not intended to limit the scope of the present disclosure.

BRIEF DESCRIPTION OF DRAWINGS

The drawings described herein are for illustrative purposes only of selected embodiments and not all possible implementations, and are not intended to limit the scope of the present disclosure.

FIG. 12 illustrates a use case description for the MSS Services to start an MSS Engine;

FIG. 13 illustrates a use case description for the MSS Services to stop an MSS Engine that is in operation;

FIGS. 14A and 14B illustrate a use case description for the MSS Services to install an element library on an MSS Engine;

FIGS. 15A and 15B illustrate a use case description for the MSS Services to update an element library on an MSS Engine;

FIG. 16 illustrates a use case description for the MSS Services to uninstall an element library on an MSS Engine;

FIG. 17 illustrates a use case description for the MSS Services to aggregate datapoints from an MSS Engine;

FIG. 18 illustrates a use case description for the MSS Services to retrieve the status of an MSS Engine;

FIG. 19 illustrates a use case description for the MSS Services to retrieve statistics for an MSS Engine;

FIG. 20 illustrates a use case description for the MSS Services to provide a mechanism that allows a datapoint subscriber (such as, an application) to subscribe for datapoint changes in the MSS TSD;

FIG. 21 illustrates a use case description for the MSS Services to provide configuration updates in the MSS Services, MSS Engines, and MSS TSD;

FIG. 22 illustrates a use case description for the MSS TSD to store datapoints collected by the MSS Engines;

FIG. 23 illustrates a use case description for the MSS TSD to summarize datapoints;

FIG. 24 illustrates a use case description for the MSS TSD to provide access to the TSD data store;

FIG. 25 illustrates a use case description for the MSS TSD to provide access to the datapoints within the TSD data store;

FIG. 26 illustrates a use case description for the MSS TSD to provide access to the configuration settings of the MSS TSD;

FIGS. 27A and 27B illustrate a use case description for the MSS Engines to provide automatic discovery of managed elements;

FIG. 28 illustrates a use case description for the MSS Engines to provide automatic discovery of unmanaged elements;

FIG. 29 illustrates a use case description for the MSS Engines to provide discovery of manually added managed elements;

FIGS. 30A and 30B illustrate a use case description for the MSS Engines to collect datapoints on a time interval;

FIG. 31 illustrates a use case description for the MSS Engines to collect environment datapoints from an appliance;

FIG. 32 illustrates a use case description for the MSS Engines to collect datapoints based on certain rules;

FIG. 33 illustrates a use case description for the MSS Engines to collect datapoints on-demand;

FIG. 34 illustrates a use case description for the MSS Engines to collect datapoints based on events;

FIG. 35 illustrates a use case description for the MSS Engines to collect and aggregate datapoints based on certain rules;

FIG. 36 illustrates a use case description for the MSS Engines to create MSS Engine events;

FIG. 37 illustrates a use case description for the MSS Engines to transform events into MSS Engine events;

FIG. 38 illustrates a use case description for the MSS Engines to handle events from unmanaged elements;

FIG. 39 illustrates a use case description for the MSS Engines to handle unknown events;

FIG. 40 illustrates a use case description for the MSS Engines to consolidate events;

FIG. 41 illustrates a use case description for the MSS Engines to filter disabled events;

FIGS. 42A and 42B illustrate a use case description for the MSS Engines to detect datapoint threshold violations;

FIG. 43 illustrates a use case description for the MSS Engines to execute commands on-demand;

FIG. 44 illustrates a use case description for the MSS Engines to execute commands that are triggered by Events;

FIG. 45 illustrates a use case description for the MSS Engines to execute commands that are based on thresholds;

FIG. 46 illustrates a use case description for the MSS Engines and MSS Services to synchronize information contained in the DCIM Data Store and information contained in the MSS Engine Data Store such as containers, managed elements and their relationships;

FIG. 47 illustrates a use case description for the MSS Engines and MSS Services to synchronize the topology for discovered managed elements;

FIG. 48 illustrates a use case description for the MSS Engines and MSS Services to synchronize managed element properties;

FIG. 49 illustrates a use case description for the MSS Engines to set the operating state of a managed element;

FIG. 50 illustrates a use case description for the MSS Engines to connect to a managed element using an element library;

FIG. 51 illustrates a use case description for the MSS Engines to collect datapoints using an element library;

FIG. 52 illustrates a use case description for the MSS Engines to execute commands using an element library;

FIG. 53 illustrates a use case description for the MSS Engines to start an element library;

FIG. 54 illustrates a use case description for the MSS Engines to stop an element library.

Corresponding reference numerals indicate corresponding parts throughout the several views of the drawings.

DETAILED DESCRIPTION

Figure 1:
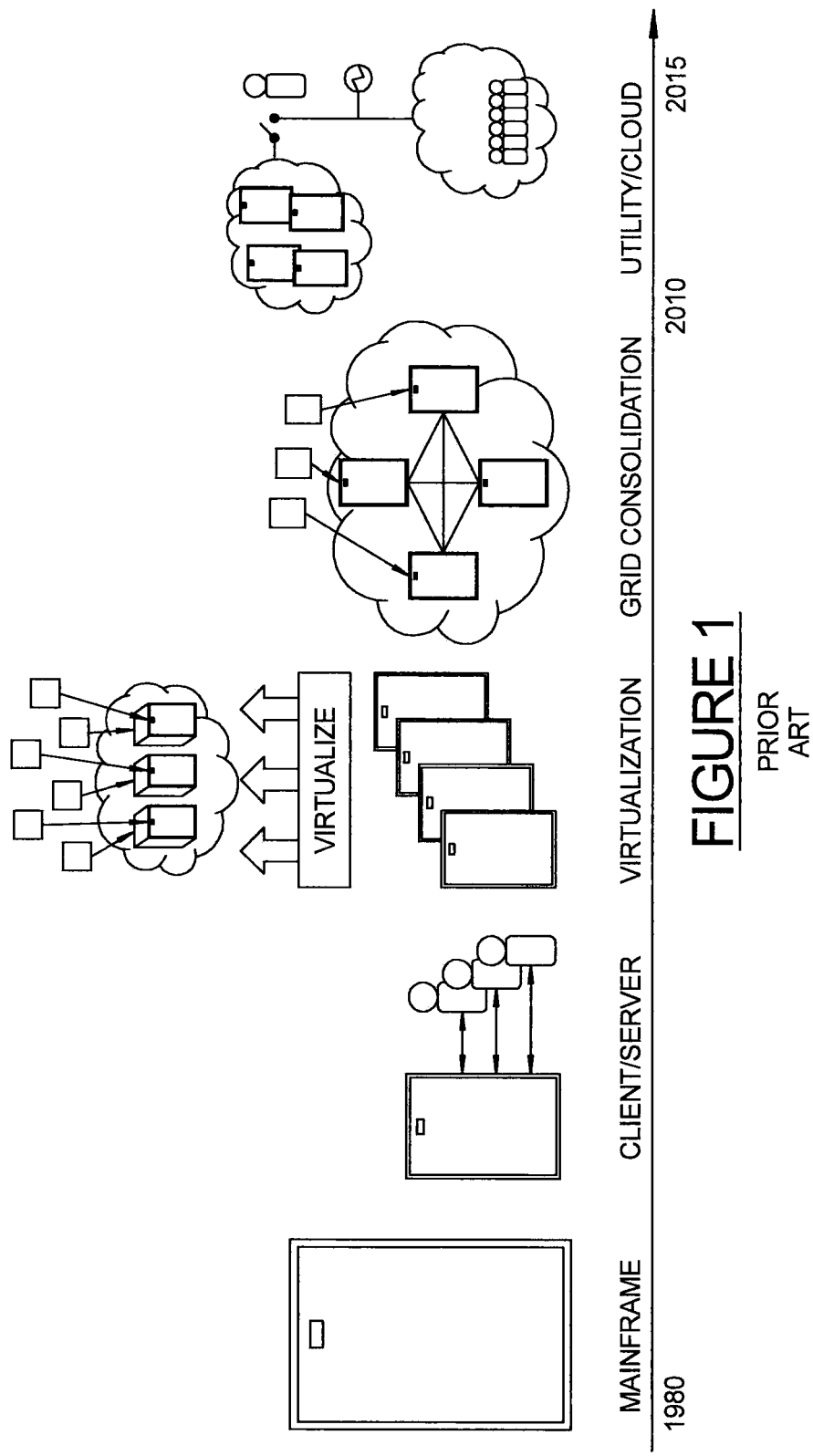
FIG. 1 is a high level representation of changes that the common data center model has progressed through since its origins in mainframe computing.
Figure 2:
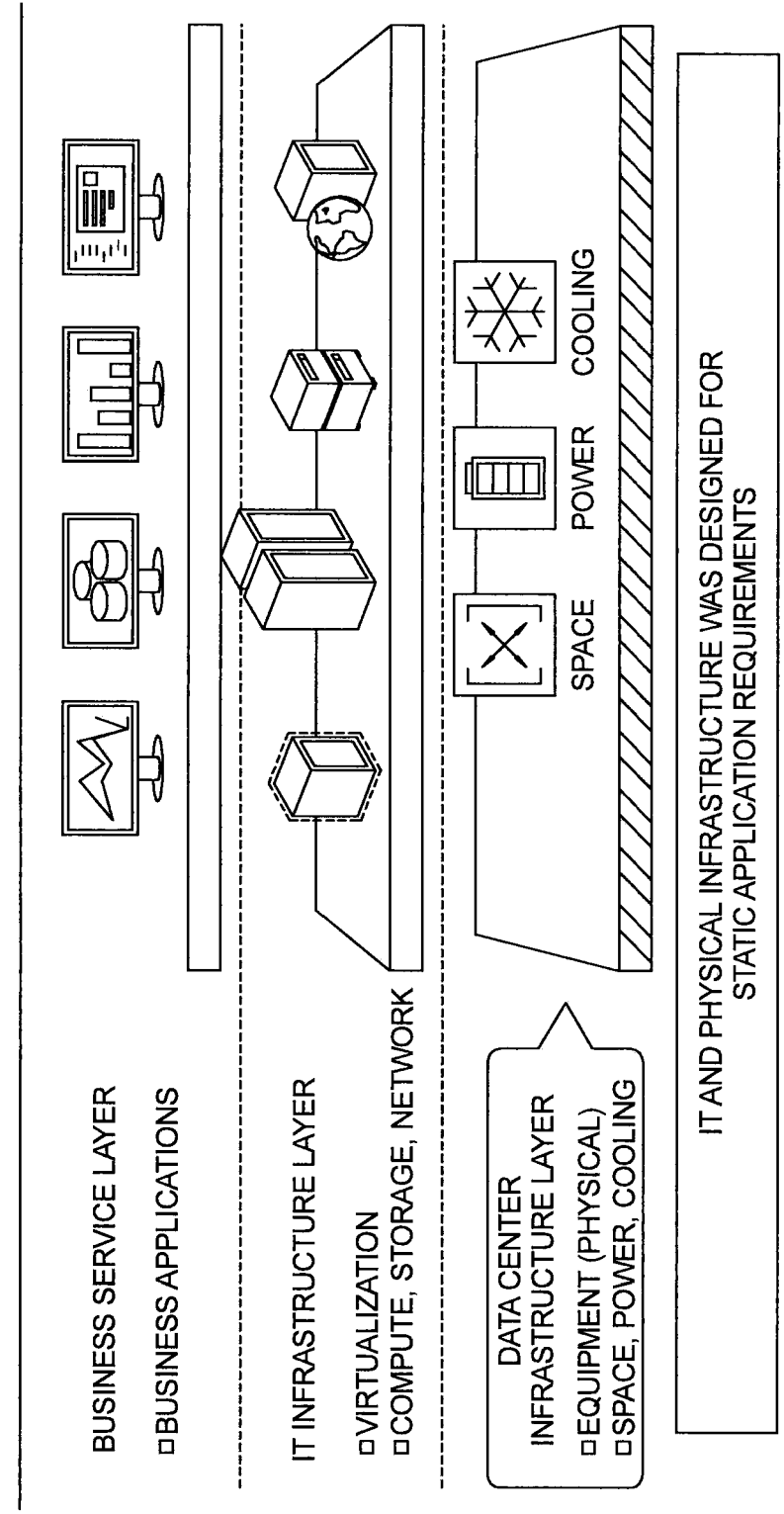
FIG. 2 is a high level representation of one example of the various components that may be used in the various functional layers of a typical existing data center.

Example embodiments a Data Center Infrastructure Management (hereinafter "DCIM") Solution 10 will now be described more fully with reference to the accompanying drawings.

Overview

This section provides a general summary of the disclosure, and is not a comprehensive disclosure of its full scope or all of its features. The DCIM Solution 10 is a modularly expandable family of hardware and software products that are designed to manage all the elements of a datacenter from a central location. In particular, the DCIM Solution 10 may include one or more DCIM hardware appliances (hereinafter simply the "DCIM Appliances") and a suite of software products (hereinafter the "DCIM Software Suite"). The DCIM Solution 10 has the capability to manage Microsoft Windows® servers, Linux® servers, UNIX® servers, storage and serial devices, service processors, rack/environmental sensors, data center power units, cooling units, and power distribution units (PDUs), with all data being gathered by a common collection engine. It allows data center operators to have full access to monitor and control every piece of equipment in the data center.

Until now, to manage a data center, multiple point solutions have been needed. The DCIM Solution 10 brings all of these point solutions into a single product suite. Previously, a plurality of independent hardware devices have been required, such as remote access application and associated hardware such as Avocent's KVM appliance to manage Windows® servers; the Avocent® Advanced Console Server (ACS) to manage Linux®/UNIX® servers, serial devices and iPDU; the Avocent® MergePoint™ Service Processor Manager; the Liebert® Rack Data Unit (RDU) to manage rack and environmental sensors, and the Liebert® SiteLink™ communications interface. Previously, a plurality of independent software applications have also been typically been required, such as: the Avocent® MergePoint Infrastructure Explorer data center management software; the Liebert® SiteScan Web centralized monitoring and control system; Emerson Network Power ASCO PowerQuest™ power interface software to monitor power and cooling equipment; and the Aperture® Vista enterprise software solution. By consolidating multiple software appliances into the consolidated software platform that forms the DCIM Software Suite of the DCIM Solution 10, and multiple hardware appliances into the aggregated DCIM hardware appliance, the DCIM Solution 10 not only frees up physical space on an equipment rack, but the operator's span of control of the data center is enhanced. This allows the data center manager to even more effectively manage and control servers and other computing/storage devices, power equipment, and cooling systems to optimize performance and energy usage.

In addition to the obvious benefits that the DCIM Appliances provide, the DCIM Software Suite makes managing the datacenter easier and even more efficient than what was previously possible. The software modules that comprise the DCIM Software Suite may run on a common host server apart from the DCIM Appliances and may work to provide a complete and accurate view of the data center, while still allowing the user to manage and control every aspect of the data center. The host server receives data from all of the DCIM Appliances throughout the data center via their Manageability Subsystem (MSS) collection engines. By using the DCIM Software Suite modules, the data center manager can tap into the real-time data, view reports, and manage the devices remotely from a rich, web-based, graphical user interface ("GUI").

It should also be noted that the DCIM Appliances and the DCIM Software Suite can be implemented separately and scaled to fit a user's need. By implementing the DCIM Appliances on their own, the user can still access the DCIM Appliances remotely, and therefore access the devices connected to them as well. However, the user would not benefit from the reports and enhanced management abilities that the DCIM Software Suite provides. Likewise, the DCIM Software Suite can be implemented in the data center without the DCIM Appliances, although without the physical connectivity provided by the DCIM Appliances, real-time data collection, monitoring and control are not supported.

DCIM Appliance and DRIP (Hardware)

Figure 3:
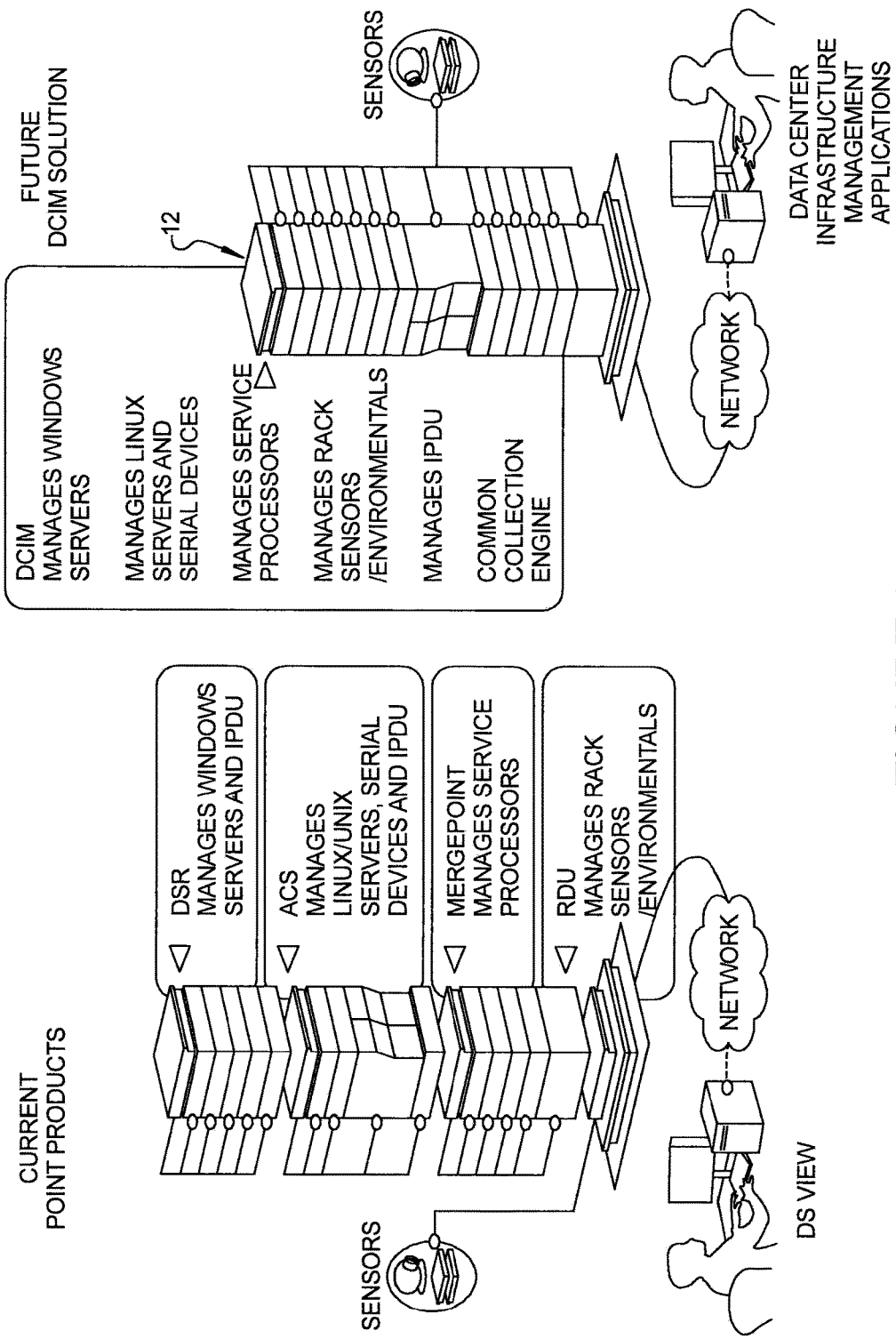
FIG. 3 is a high level representation of one example of a single DCIM Appliance being used to perform the functions of a plurality of hardware devices.

A DCIM appliance 12 may comprise one or more hardware appliances that typically reside in selected equipment racks or that may be mounted on a wall within a datacenter. The arrangement of interfaces on the DCIM appliance 12 provides the user with access to various pieces of equipment for control and performance metric collection. As illustrated in FIG. 3, the single DCIM appliance 12 consolidates the functions of several previous products into one piece of hardware. The DCIM appliance 12 may replace the existing Avocent® DSR® switches, Avocent® Advance Console Server (ACS), MergePoint Service Process Manager, (SPM), and the Liebert® Rack Data Unit (RDU) products, and consolidate all of their functionality into one or more hardware appliances. A base embodiment, of the appliance 12 termed the "DCIM SP", may replace the existing service process manager (SPM) hardware. The DCIM SP can have at least two specific port configurations, one with 24 IP ports and another with 40 IP. Both versions can include at least eight dedicated serial ports. For each, the IP ports can be isolated from the network interface ports and function as a layer two switch. This arrangement preserves the configuration of the current SPM. The numerous IP ports and the eight dedicated serial ports provide an appliance that can service an entire rack of service processors and also provide control of serial based switches and power strips in the rack. In addition to the two physical port SPM variants, there is a logical version that has only the main network ports and does not have any rear panel ports, the DCIM SP Logical.

In addition to the DCIM SP embodiment, the DCIM appliance 12 may have at least three higher-end embodiments labeled the "DCIM Branch 8", the "DCIM Entry", and the "DCIM Enterprise". This higher-end group of embodiments of the DCIM appliance 12 provides auto-sensing ports that can automatically select between IP or serial connections. The DCIM Branch 8 may not have RDU connections while the DCIM Entry and DCIM Enterprise devices may have RDU connections. The RDU interfaces on the DCIM Entry and DCIM Enterprise appliances mimic the main connectivity of the RDU appliance and allow similar functions to be included on the higher-end DCIM devices. The higher-end DCIM appliance 12 embodiments may also have the ability to interface with an IQ module providing traditional KVM functionality. This IQ module, called a "Digital Rack Interface Pod" (DRIP), provides digitization of analog video along with keyboard and mouse control and virtual media access.

cates to the DCIM appliance 12 the AAA function may inform each of the guest applications that the user is valid. The user does not need to authenticate to each guest application. Additional host pieces may include items such as the Linux® kernel, base file system and hardware component driver support. Each of the DCIM appliances 12 may also host a manageability subsystem (MSS) software engine (to be discussed in connection with FIG. 5).

In summary, the at least six different configurations for at least two DCIM platforms, platforms "A" and "B", are shown in the following table.

| | Platform | | | | | |
|---|---|---|---|---|---|---|
| Function | DCIM SP I | DCIM SP II | DCIM SP Logical | DCIM Branch 8 | DCIM Entry | DCIM Enterprise |
| Com Express | Atom D410 | Atom D410 | Atom D410 | Atom D410 | Atom D410 | i7-620LE |
| Memory | 4 GB DDR2 | 4 GB DDR2 | 4 GB DDR2 | 4 GB DDR2 | 4 GB DDR2 | 8 GB DDR3 |
| HDD | 250 GB | 250 GB | 250 GB | 250 GB | 250 GB | Dual 2TB |
| Dedicated IP Ports | 24 | 40 | 0 | 0 | 0 | 0 |
| Dedicated Serial Ports | 8 | 8 | 0 | 0 | 0 | 0 |
| Autosensing Ports | 0 | 0 | 0 | 8 | 32 | 40 |
| RDU Functions | None | None | None | E-Link and RS-485 | All | All |
| MSS Features | Yes | Yes | Yes | Yes | Yes | Yes |
| Power Supply Wattage | 125 W | 125 W | 125 W | 125 W | 125 W | 125 W |
| Power Configuration | Single/Dual | Single/Dual | Single/Dual | Single | Single/Dual | Single/Dual |
| Enclosure | Shallow | Shallow | Shallow | Extended | Extended | Extended |

The key functions of the DRIP are:
Providing USB and PS/2 ports for device keyboard and mouse;
Digitizing analog video data and sending it to the DCIM Appliance;
Connecting to a server's Service Processor for transmitting IPMI data to the DCIM Appliance;
Enable access to virtual media; and
Enable Smart Card support.

In order to support the various hardware platforms, an appliance host software platform is provided. The appliance host platform may be based on the Linux® vServer patch and functions as an OS virtualized platform. This allows Linux® operating system based applications to run with minimal changes on top of the DCIM appliance 12 host platform. Building the DCIM appliance 12 in this manner minimizes the changes necessary to combine the individual technologies into a single appliance. It also facilitates groups being able to concentrate on their core function without needing to know the details of the DCIM appliance 12 host platform.

Figure 4A:
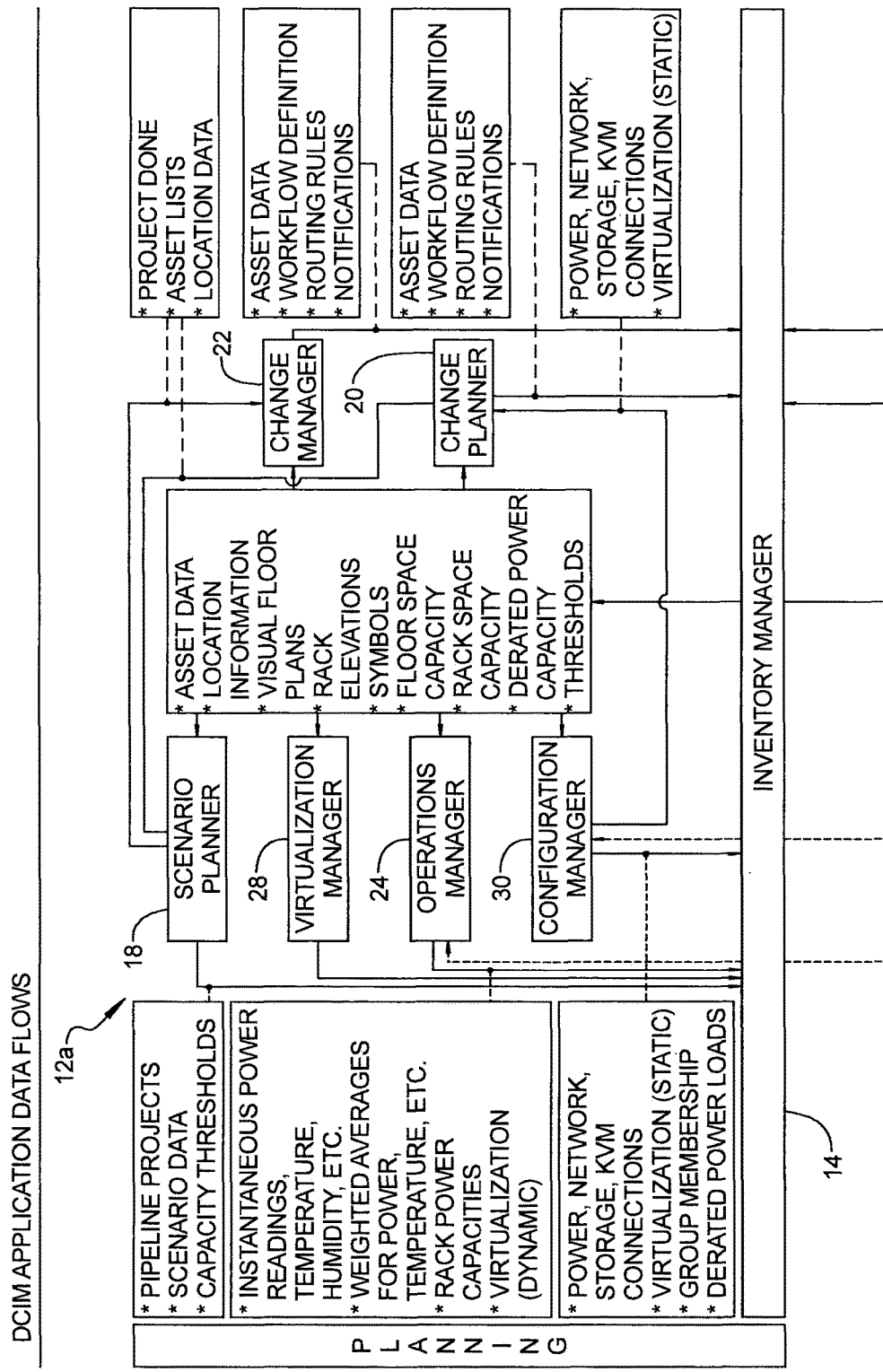
FIG. 4 is a high level diagram of exemplary modules that may be used to form the DCIM Software Suite.
Figure 4B:
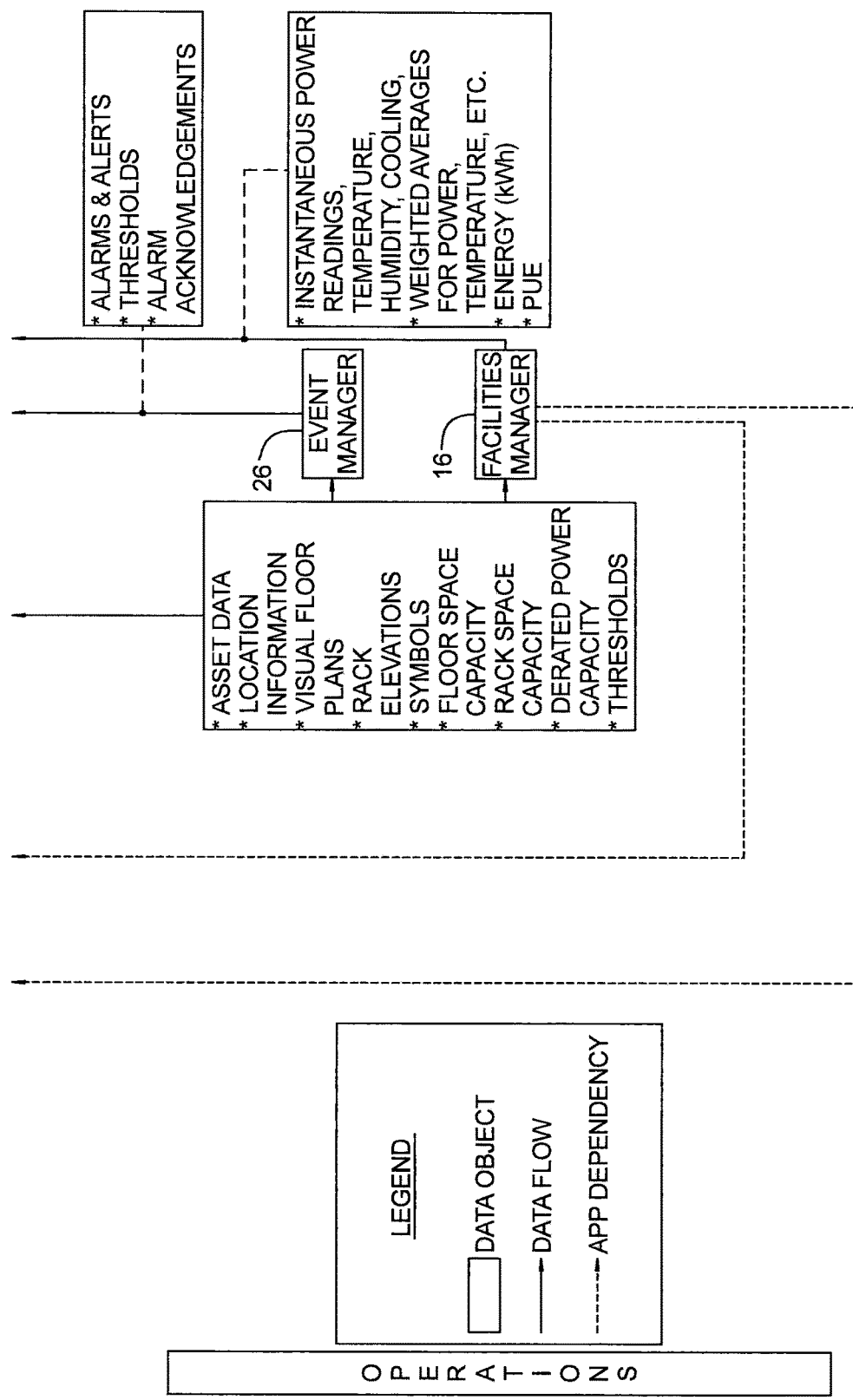

An important advantage of the DCIM appliance 12 software architecture is that it makes the finished devices look like a single cohesive appliance, even though they may be constructed from several underlying disparate software applications. To achieve this, the host system may be set up to provide several system functions that provide a gateway between the external user and the internal guest applications. These may include licensing, authentication, authorization and auditing (AAA), and user interfaces. These functions may take the external input and map it on to the correct application without the user requiring any knowledge of the underlying architecture. For example when a user authenti- DCIM Software Suite A DCIM Software Suite 12a of modules is modular, expandable and designed to make the operation, management, configuration or expansion of a datacenter seamless and simple. One example of the DCIM Software Suite 12a of modules is shown in FIG. 4 and may include: an Inventory Manager 14, a Facilities Manager 16, a Scenario Planner 18, a Change Planner 20, a Change Manager 22, an Operations Manager 24, an Event Monitor 26, a Virtualization Manager 28 (and potentially a Rack Power Manager, and a Configuration Manager 30). These modules integrate seamlessly with one another and provide a rich user interface, with the ability to drag and drop items, show high-fidelity images of assets and reported data, and compile user-specific views with combinations of available facilities.

The DCIM Software Suite 12a is flexible enough to accommodate the preferences of the system administrator in a number of different areas, from the operating system and database to the web browser interface. The software modules can be installed on Microsoft® servers, Linux® servers, or Sun® servers, and possibly on other brands of servers. Microsoft® SQL and Oracle® databases are supported. To access the software modules, various commercially available operation systems and web browsers are supported.

For administrators who use existing products of Emerson Network Power or the Avocent® Corporation, for example the Aperture® Vista® data center resource management system, the Liebert® Site Scan® centralized monitoring and control system, or Avocent® MergePoint™ Infrastructure Explorer software (AMIE), the DCIM Software Suite 12a supports the migration of data. This data may include all assets and plan data, associated projects, and symbols libraries. The import may be manually triggered but will not necessitate the manual mapping of any asset, placement, plan or project data from AMIE to the modules of the DCIM Software Suite. The individual DCIM Software Suite 12a software modules are described in detail in the pages to follow.

DCIM Inventory Manager Module 14

The Inventory Manager module 14 manages DCIM records, which constitute the data center inventory of equipment. Often, data center managers and site technicians manage equipment lists through a variety of means such as spreadsheets, documents, drawing files, finance systems, bills of lading, etc. These are not ideal methods, and tend to be ad-hoc in format, inaccurate, and frequently out-of-date. They also do not provide timely access to information about where physical equipment is located and its purpose. The DCIM Inventory Manager module 14 replaces all of these ad-hoc methods with a system that gives a clear picture of the entire inventory of the data center, with equipment counts of IT assets such as servers and switches, and critical infrastructure equipment like power distribution units ("PDUs") and uninterruptible power supplies ("UPSs"). It allows users to quickly see where equipment is located and gives a gross total of power and space usage.

To do this, the DCIM Inventory Manager module 14 may rely on import software capabilities and specialized views, for example: 1) Import capability to extract equipment records from various sources, and combine information from these sources into a complete data set; 2) Geography Views, which allow users to provide the global location of data center installations and drill down to show more detailed location views, such as campus views, regional views, pictures of buildings, etc.; 3) Textual and Graphical Inventory Lists, which are textual views for "placed" and "un-placed" inventory (items which have not been assigned a location); 4) Data Center Portfolio View, which lists the data centers being managed by the system; 5) Floor Plans and Elevation Views for "placed" inventory (items which have been assigned a location); 6) Workspaces, which allow users to combine graphic and data elements from other views to give them a "dashboard" of critical information which they can reference at a moment's notice; and 7) Layers, which allow users to see information from other applications within the Inventory Manager graphic drawings.

The DCIM Inventory Manager module 14 is able to create, update, and delete all represented objects. These objects may include:

IT Spaces—areas where IT equipment is located and housed, and at a more granular level, where equipment is installed.

Floors—areas which contain one or many data center spaces, and correlate to a floor in a building.

Data Centers—areas that are designed to house and run IT equipment. Typical data centers have raised floor spaces as well as dedicated power and cooling equipment.

Spaces—regions of a data center floor in which IT equipment is directly installed. Typical data center spaces have raised floors and racks to house equipment, and are secured from unauthorized entry.

Zones—geographic areas of the data center as defined by the customer, which allow the tabulation of capacity and resource usage within areas of the overall data center. In our definition, a zone is one contiguous space within the data center floor.

Other spaces (walkways, free space)—spaces which, when deducted from the total data center space allow for the calculation of usable data center space.

Enterprise—Information about the Enterprise is tracked to give context for the entire data center portfolio and the teams that manage them. Enterprise information may be tracked at the global level in the software.

IT Equipment—may include all equipment used for the direct purpose of data processing, communications, and storage, and the equipment used to house them. This includes: racks, benches, shelves, data closets; servers, network appliances; symbols, placeholders; and sensor equipment.

Critical Infrastructure—may include all devices, which support the cooling and power distribution for the data center space, including: local utility entrance meters, surge protection devices, transformers, switchgears (HV/MV/LV), generators, uninterruptible power supplies (UPSs), energy storage devices & systems (e.g., batteries, flywheels, fuel cells), power disconnects (e.g., circuit breakers, switches/power-ties), static transfer switches, floor mount PDU systems, power panels, remote power panels, busway power distribution, commando sockets, rack PDU, solar arrays, cooling towers, chillers, pumps, economizers (water/air), floor mount CRAC, in-row CRAC, condensers, heat exchangers, and water reservoirs (tanks).

DCIM Configuration Manager Module 30

The DCIM Configuration Manager module 30 expands the management of DCIM records that are provided by the DCIM Inventory Manager module 14. The DCIM Configuration Manager module 30 consumes the capabilities of the DCIM Inventory Manager module 14, extending them to manage relationships between chosen assets. These relationships may include, without limitation, connections, logical groups and redundancies. To do this, the DCIM Configuration Manager module 30 may incorporate various features, such as:

Connection Views, which allow users to details of the connections between any placed assets. This may include topology, end-to-end trace, dependency and redundancy;

Panel Schedules, which allow users to view details of a panel and the breakers within that panel;

Alerting capabilities, which allow a user to specify a threshold for a plan, group or assets and alert on the consumption against that threshold;

Customizable views, which allow a user to customize the views of the application data that they would like to use and navigate; and Web Services Interface, which allows a user to manipulate the application data from an external software entity.

DCIM Facilities Manager Module 16

The DCIM Facilities Manager module 16 provides complete performance utilization and event management capabilities for critical infrastructure equipment. It provides realistic, virtual views of the equipment and racks on the data center floor and surrounding equipment rooms, as well as underlying electrical one-line schematics of the power system and piping and instrumentation diagrams of the cooling system. It may also provide equipment maintenance features to assist in maintenance tracking, scheduling and equipment commissioning. By providing a system view of power and cooling infrastructure as designed, the DCIM Facilities Manager module 16 allows the user to view the power consumption and cooling capacity (both in-use and stranded) of each device, or at the system level. In addition, it lets the user reserve blocks of load on the power and cooling systems, and project the power and cooling capacity needs into the future, based on historic capacity use.

The Facilities Manager module 16 may provide, both textually and graphically, a number of useful views that allow the user to better understand and manage the data center infrastructure. The DCIM Facilities Manager module 16 may display floor plans, electrical diagrams, air distribution, and piping and instrumentation diagrams. The DCIM Facilities Manager module 16 may provide real-time performance status of individual elements or groups of infrastructure equipment. Each item in the diagram allows the user to initiate the following actions or control operations, if supported by the equipment:

Turn on/off the specific piece of equipment/device (if applicable);

Change user configurable items (e.g., set-points, labels); and

View detailed information for each piece of equipment/device.

In addition to primary view diagrams, the DCIM Facilities Manager module 16 may have at least three separate dashboard views to give the user an overall picture of real time operations in the data center infrastructure. An "Industry Efficiency Dashboard" may display the standard efficiency metrics of the data center's energy consumption (e.g., PUE/DCiE). A "Utilities Consumption Dashboard" may display the total power load (kW), total cooling load, water consumption if applicable, and the overall utilities cost. A "Capacity Dashboard" may display a breakdown of the aggregated capacity of the data center equipment per type (e.g., the current capacity of all floor mount PDUs), as well as a breakdown of the stranded capacity of the data center power and cooling systems.

The DCIM Facilities Manager module 16 also provides significant scalability, for example (or possibly more) supporting up to 5000 critical infrastructure equipment and instrumentation devices, with an approximate number of 200 data points each. The equipment data (all parameters other than events) may also be polled at a minimum interval, for example every five minutes. Some examples of this data may include temperature, percentage load of a UPS, and circuit breaker state just to name a few example metrics.

Scenario Planner Module 18

The DCIM Scenario Planner module 18 provides the ability to build and compare cost effective scenarios of future resource usage in the data center. It may utilize information from data center infrastructure management applications and real world measurements to map an accurate history of resource usage, and project future trends of growth and decline. With the DCIM Scenario Planner module 18, data center managers and capacity planners can determine the best course of action. Whether it means that installations should be decommissioned and consolidated, or new installations be built, the DCIM Scenario Planner module 18 allows the customer to compare and contrast different scenarios of future data center use. The effect of technology updates, increased density within the data center space, upgrades of the critical infrastructure for more efficient energy use, and gauging demand on IT can be compared to build a plan of action that meets service levels at the lowest possible cost. Once the course of action has been determined, the DCIM Scenario Planner module 18 assists in the communication of the plan to management. Software Capabilities that may be included in DCIM Scenario Planner include 18, without limitation, one or more of the following:

The ability to collect and understand past trends of aggregated global data center infrastructure resources;

The ability to project past aggregated usage trends into the future, to predict base infrastructure needs globally;

The ability to conduct "what-if" scenario planning for infrastructure needs, and to assess the impact of data center moves, adds, decommissions and consolidations; and The ability to establish a workflow process for project pipeline management, including refinements by technical experts and system owners, and approvals by business managers.

DCIM Change Planner Module 20

The DCIM Change Planner module 20 allows the users to plan and execute changes in the data center infrastructure. To do this, the DCIM Change Planner module 20 may rely on:

Plan views, allowing users to see details of the planned projects;

Timelines, allowing users to see changes planned for a chosen asset throughout the project; and Alerting capabilities, allowing users to be notified when a task is completed.

The DCIM Change Planner module 20 allows the user to create any number of projects, manage those projects and navigate through them. The user can assign a name, tag, description, target completion date and owner to the project, and can assign individual tasks to the project as well. Once a project has been created its details may be visualized in a calendar format with further details made available for any selected project or tasks. The project can be edited by moving project dates, deleting tasks or adding tasks and the project can be deleted. In addition to specific tasks, the user can assign generic tasks, which do not relate to any particular placed asset in the module. The DCIM Change Planner module 20 also allows the user to assign and view dependencies to other tasks in the project. With the capability to create and manage multiple projects, the possibility arises that there may be conflicts between projects, but the DCIM Change Planner module 20 allows the user to view the conflicts and their severity, and resolve the conflict by changing the parameters of the projects.

Once a project is created and tasks assigned, the DCIM Change Planner module 20 allows the user to view a timeline of the project along with visualizations of the changes associated with any assets affected by the project. The user can see a view of the chosen asset (e.g., a rack), with the assets shown in its various states of change that are scheduled to happen during the lifespan of the project. The DCIM Change Planner module 20 may also display a view of the work to be carried out during a project, colorized by chosen dates, which allows a timeline to show the IT person what is happening on a given date for any chosen assets.

For a given project, the DCIM Change Planner module 20 also allows the user to record all project activity and notify any affected personnel of the activity. A user is notified via email once their designated task or project has been created, edited, has a conflict or is tagged as completed. In addition, the user can create customized reports, import project information in a standard format from an external source, and export project information to PDF or spreadsheet for external use.

DCIM Change Manager Module 22

The DCIM Change Manager module 22 expands the planning and execution capabilities of the DCIM Change Planner module 20 to impose predefined processes or workflows on projects and communicate progress and decisions to project members. To do this, the DCIM Change Manager module may rely on the following software capabilities and specialized views:

Template Workflow Processes that allow a workflow designer to design and publish workflow processes to be used by future projects.

Interaction with DCIM modules, which allows the workflow process to interact with DCIM modules to verify that certain required actions have been completed.

Supports integration with third party IT systems to allow a designer to configure an interface to allow an external source to interrogate the application data and initiate workflow processes.

Human Interaction in a workflow process, which allows a user to interact with a process that was created from a template.

The DCIM Change Manager module 22 provides the ability to create a project template with user defined high level actions supported by lower level tasks provided by the DCIM Change Planner module 20. Project templates may be used to create projects when needed, where the project may follow the template pre-defined steps to completion. A template may contain, without limitation:

Pre-defined high level tasks related to the installed Inventory Manager modules (e.g., "Move server" or "Add connection").

User-defined task categories (e.g., "Move", "Add").

Trigger points to existing workflow templates.

Once a template is created the user can assign roles for use in the template. The user assigns a name, description, and tag to a role, and can assign other users. The DCIM Change Manager module 22 allows for users to be assigned to multiple roles if necessary. In addition to roles, users can create workflow procedures and assign a name, description and tag to each workflow. Once a workflow is created, steps can be added (whether user defined, or predefined) and specific users or roles can be assigned to each step. To add further detail, the user can define rules, such as entry and exit criteria, to each step. Steps may be linked together to define a progression and sub-processes can be created through certain steps.

Once the user has a workflow set up, he/she can simulate a "run" of the execution to identify any errors and validate the workflow. The user may also want to set up customized notifications for various workflow events. The DCIM Change Manager module 22 allows the user to do this, and will propagate notifications to the participants when a task begins, completes, or when any other workflow event occurs.

DCIM Operations Manager Module 24

The DCIM Operations Manager module 24 combines real-world information with managing the data center infrastructure configuration. It provides interfaces to measure performance and utilization across the data center infrastructure and to reveal current available headroom in racks such that the appropriate placement of equipment can be achieved. The DCIM Operations Manager Module 24 may connect to real time data feeds (for power and temperature) from the MSS service to compare and validate the performance guidelines and design criteria established in the Configuration Manager module 30 capabilities.

The DCIM Operations Manager module 24 may also be used to optimize power, cooling, and space capacity to bring about overall optimization of data center infrastructure resources. The business problem this module solves is around the management of power and cooling. Large buffers of power and cooling are typically maintained by data center managers to protect systems from outage due to power spikes and periods of increased usage. The amount of buffer to reserve is typically not managed efficiently. Reduction of these buffers allows better utilization of resources. For example, more equipment may be located in one or more equipment racks while sufficient power and cooling needs are still met for all equipment items.

One important feature of this product is that it provides a natural and elegant approach to viewing monitored information about the data center—of which there is a large amount generated by many systems in many different formats. The result of crunching all of this data and seeing it in a usable form makes possible a more accurate understanding of the operation of the data center environment, a better understanding of the true cost of energy use, maximization of the investment in the data center, and ensuring continued 24/7 operations for IT.

The software capabilities are inherited from those defined for the DCIM Configuration Manager module 30 and the DCIM Inventory Manager module 14. The DCIM Operations Manager module 24 adds new features to the DCIM Configuration Manager module 30 capabilities as listed herein. There may be, however, additional software facilities defined for the DCIM Operations Manager module such as, without limitation:

Dashboard for monitoring real-time data feed.

Additional visualizations to show temperature sensor output, and cooling parameters such as airflow.

DCIM Event Monitor Module 26

The DCIM Event Monitor module 26 provides an easy-to-understand system for managing alarms. It provides a single, unified view to monitor alarms for critical infrastructure equipment across the user's entire enterprise. Relevant information may be presented in a simple, graphical manner, making it easy to understand and respond quickly. The DCIM Event Monitor module 26 allows the user to, without limitation:

Maintain service level agreements (SLA's).

Keep the business critical IT infrastructure available and online.

Maintain critical infrastructure system redundancy.

Acknowledge and verify that actions have taken place.

DCIM Virtualization Manager Module 28

The DCIM Virtualization Manager module 28 provides tools to manage virtual infrastructure in a data center. It helps to map physical machines with virtual machines, manage the virtual machines and group the virtual machines for ease of management. The DCIM Virtualization Manager module 28 may relay the information to the DCIM Operations Manager module 24 for interfacing with virtualization management servers (e.g., VMware Virtual Center Management Server). The DCIM Operations Manager module 24 may then auto-discover host machines and virtual machines, relaying this information back to the DCIM Virtualization Manager module 28. With this information the user is able to specify the synchronization schedule of virtualization infrastructure information between virtualization management and virtualization management servers on periodic, pre-defined time intervals. The user may also initiate synchronization on a demand basis from the DCIM Virtualization Manager module 28.

With the virtualization inventory synchronized, the user is able to view the inventory in a graphical format. The DCIM Virtualization Manager module 28 may depict the virtual machines graphically against the physical inventory or servers to show which virtual machines are housed where. In addition, the DCIM Virtualization Manager module 28 may provide a cluster view (showing the groups of virtual machines in various clusters), a virtual list of servers with associated virtual machines, and a search feature allowing the user to find the specific virtual machine, cluster or server that he/she wants to manage. When the user selects the correct virtual machine, the Virtualization Manager module 28 provides the ability to access the virtual machine console by launching the virtualization provider's Remote Console, a Web browser or a RDP from a virtual machine.

Additional Details of DCIM Solution 10

Figure 5:
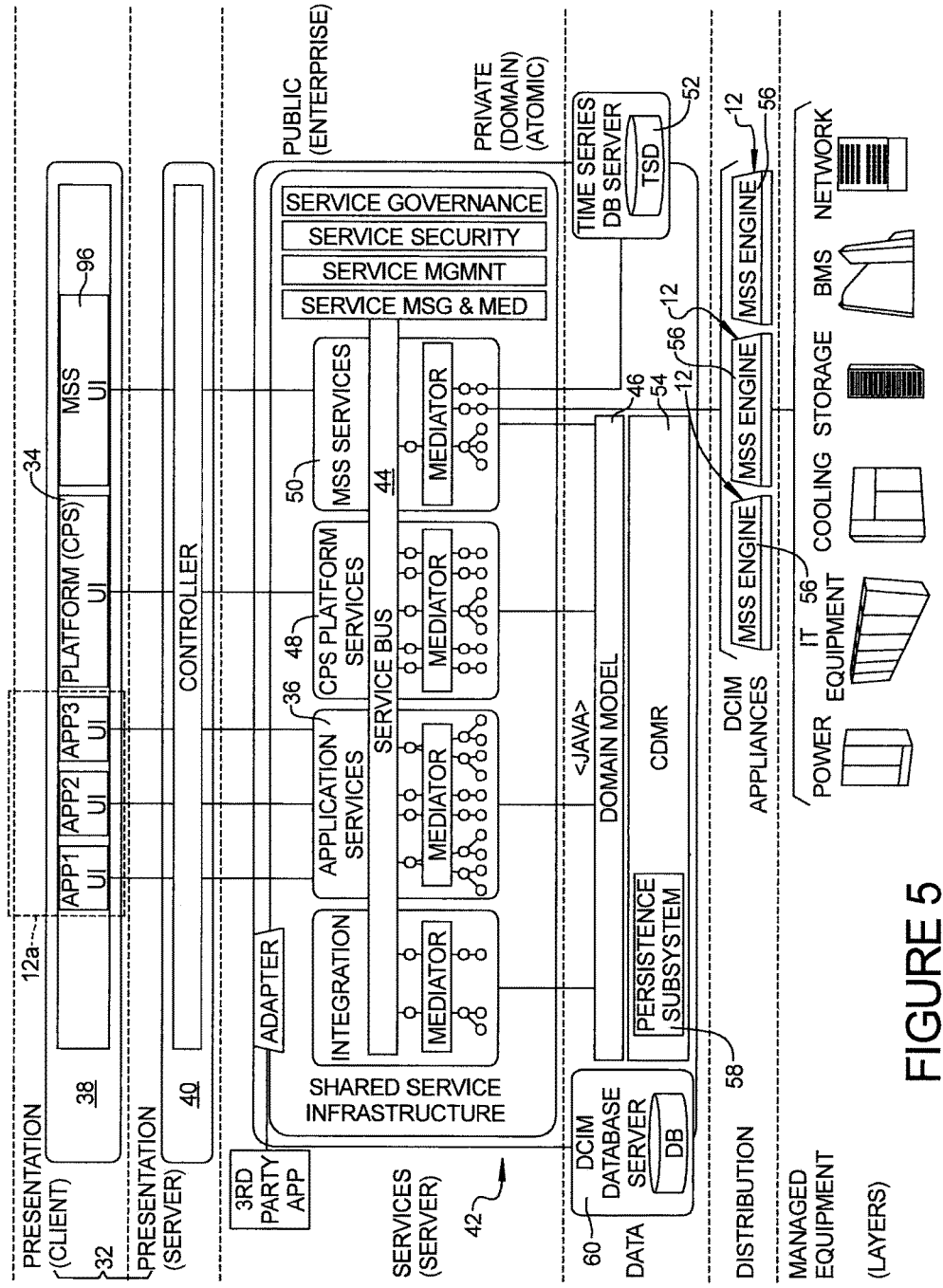
FIG. 5 is a high level diagram of the DCIM Solution architecture.

Referring to FIG. 5, various components of one example of the DCIM Solution 10 can be seen. The architecture of the DCIM Solution 10 may contain the following high level components. Each component will be described in more detail in the discussion below.

Presentation UI 32—These components represent the human interface for individual applications and for the platform. A Common Platform 34 contains a web-based Console Framework that allows individual applications and the platform to plug-in user interface components. The Presentation UI 32 consumes public interfaces exposed by a Services layer 36 that provide the actual business functionality. Logically, the Presentation UI 32 may be broken into two layers: a client layer 38, typically resident within a web browser and representing the "View" in a Model-View-Controller architecture, and a server layer 40, typically representing the Controller.

Enterprise Service Bus (ESB)—An ENP Common Platform 42 contains an Enterprise Service Bus 414 that provides a container for Business Services and provides for intelligent routing of messages between services. The architecture presumes that communications between the Presentation UI 32 layer (specifically, the controller 40) and the ESB 44 will be SOAP/HTTP, although other transports may be used based on specific application design requirements.

Application Services 36—These may be individual and/or composite services that provide product application functionality. A service composition is an aggregate of services collectively composed to automate a particular task or business process. These services 36 can be made up of both private and public services. Public services are exposed on the ESB 44 and available for other applications to consume. These application services 36 use a Domain Model 46 (for example via Java) to access business objects specific to the product domain.

Common Platform Services 48—These are utility services provided as part of the ENP Common Platform 42 and may be either individual or composite services. The ENP Common Platform 42 provides these services which are likely to be used by any product and may include services such as authentication, authorization and auditing. These services are configurable such that a Product Line Architecture PLA may select which services to include for a given PLA. For maximum extensibility, these services should be data driven such that they are also extensible by adding domain specific knowledge (e.g., a new event type unique to a given domain).

MSS Services 50—These are composite services that provide for management (e.g., Discovery, Data Acquisition, Command & Control) of managed elements (or managed devices) via a distributed real-time framework. MMS (Manageability Subsystem) Services 50 interacts with the DCIM appliances 12 to perform data acquisition and store acquired data in a Time Series Database 52 and a Common Data Model Repository CDMR 54.

Time Series Database (TSD) 52—The time-series database 52 operates to persist telemetry data sent from the MMS Services 50.

DCIM Appliance 12—The DCIM appliance 12 (or appliances 12) form a hardware appliance that is the touch point to the managed equipment or managed devices. Each DCIM appliance 12 can be loaded with several software applications including KVM, Serial, Service Processor and a "MSS Engine" 56 for data acquisition.

MSS Engine 56—The MSS Engine 56 may be a software component that can be deployed on each DCIM appliance 12 to acquire metric data and perform management (e.g., Discovery, Data Acquisition, Command & Control) on managed equipment being handled by each DCIM appliance 12. The MSS Engine 56 feeds data to the MSS Services 50 for storage in the Time Series Database 52 and the CDMR 54.

Managed Equipment (or Managed Devices or Managed Components)—Represents an entity (e.g., a "device") that is addressable and can be managed (i.e., controlled in some way) and/or monitored.

Domain Model 46—The Domain Model 46 provides a common definition of domain concepts across all applications (e.g., a shared, extensible library of domain classes that allow for application specific customization). In one example, the Domain Model 46 may be represented as native Java objects. It also delegates manageability knobs and dials type operations to the MSS Services 50.

Common Data Model Repository (CDMR) 54—The CDMR 54 forms a repository that is responsible for creating and persisting the Domain Model objects. The CDMR 54 hides the complexity of initializing domain objects and hides a persistence subsystem 58.

DCIM Datastore 60—A DCIM Datastore 60 may be a SQL database that persists the defined domain objects and other configuration information associated with these domain objects. The DCIM Datastore 60 may be in communication with the persistence subsystem 58.

Integration Services 62—Composite services that are deployed to support integration with 3$^{rd}$ Party Applications.

3$^{rd}$ Party Applications—External applications that can be integrated with the ENP Common Platform 42 (e.g., Hewlett-Packard OpenView software, CiscoWorks LAN management solution tools, the EMC Corporation EMC Smarts Application Discovery Manager (ADM)).

Technology Alliances—development of key technology alliances (internal to Emerson and external) to tightly integrate and enable a closed loop control system. Technical alliances with:

Emerson Network Power Products: Liebert Power and Cooling products to embed DCIM components to within managed devices and elements allow discovery, monitoring and control of various Liebert products.

External technology alliances (for example: Cisco, EMC and Vmware to embed DCIM components in managed devices and elements to provide detailed information on server workloads and integrate Power & Cooling consumption.

All components can be deployed on the same server, but the DCIM Solution 10 is flexible enough to allow major components to be placed on separate servers (e.g., Client, Application Server, Database Server, Report Server, etc.) for scalability and redundancy purposes.

The following is a further discussion of various components of the DCIM Solution.

Domain Model/CDMR

Figure 6:
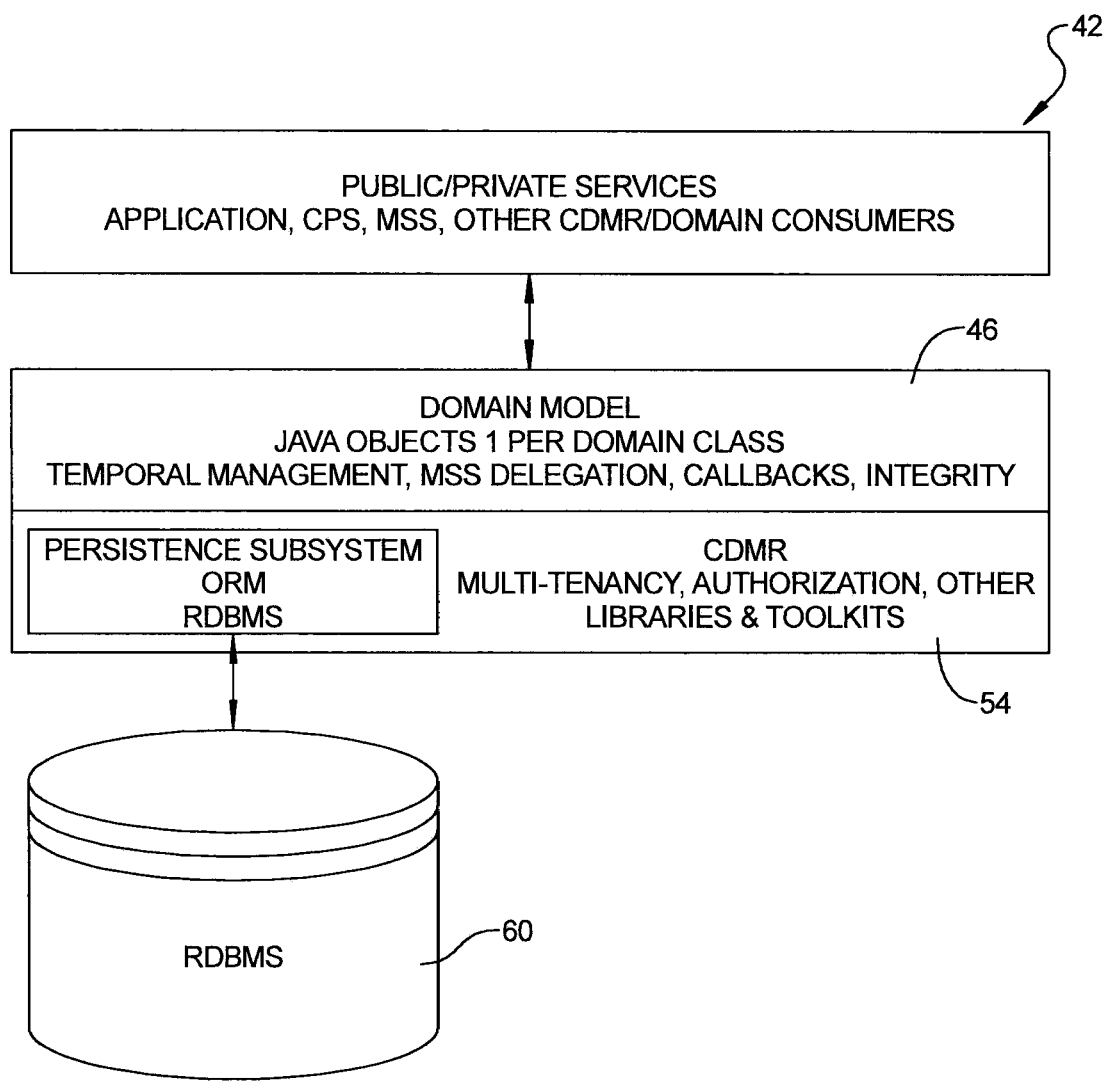
FIG. 6 is a high level diagram of showing the relationship between the Public/Private services and the Domain model and CDMR.

Referring to FIG. 6, the Domain Model 46 may be viewed as a collection of Java classes that represent data center infrastructure entities—and the context in which those entities exist. In addition, the Domain Model 46 may represent users, software licenses and other associated data center infrastructure management (DCIM) entities. These can be viewed as the "facts". These facts are used by applications and services.

A common data model may be shared across all of the DCIM application modules 14-30. Individual products often extend the DCIM product line's shared, common data model. The CDMR 54 maps Java class instances to persistent storage (in a relational database, such as the DCIM datastore 60), enforces authorization, segregates tenants, checks integrity constraints, etc. A variety of cross-cutting concerns can be addressed by the CDMR.

The Domain Model 46 is the collection of domain classes used to represent entities (under management), relationships amongst entities, and policies about entities and so on. The Domain Model 46 establishes the conventions for representing all of the known 'facts' within the DCIM domain. Then, these 'facts' are shared across all products within the DCIM product line.

Figure 7:
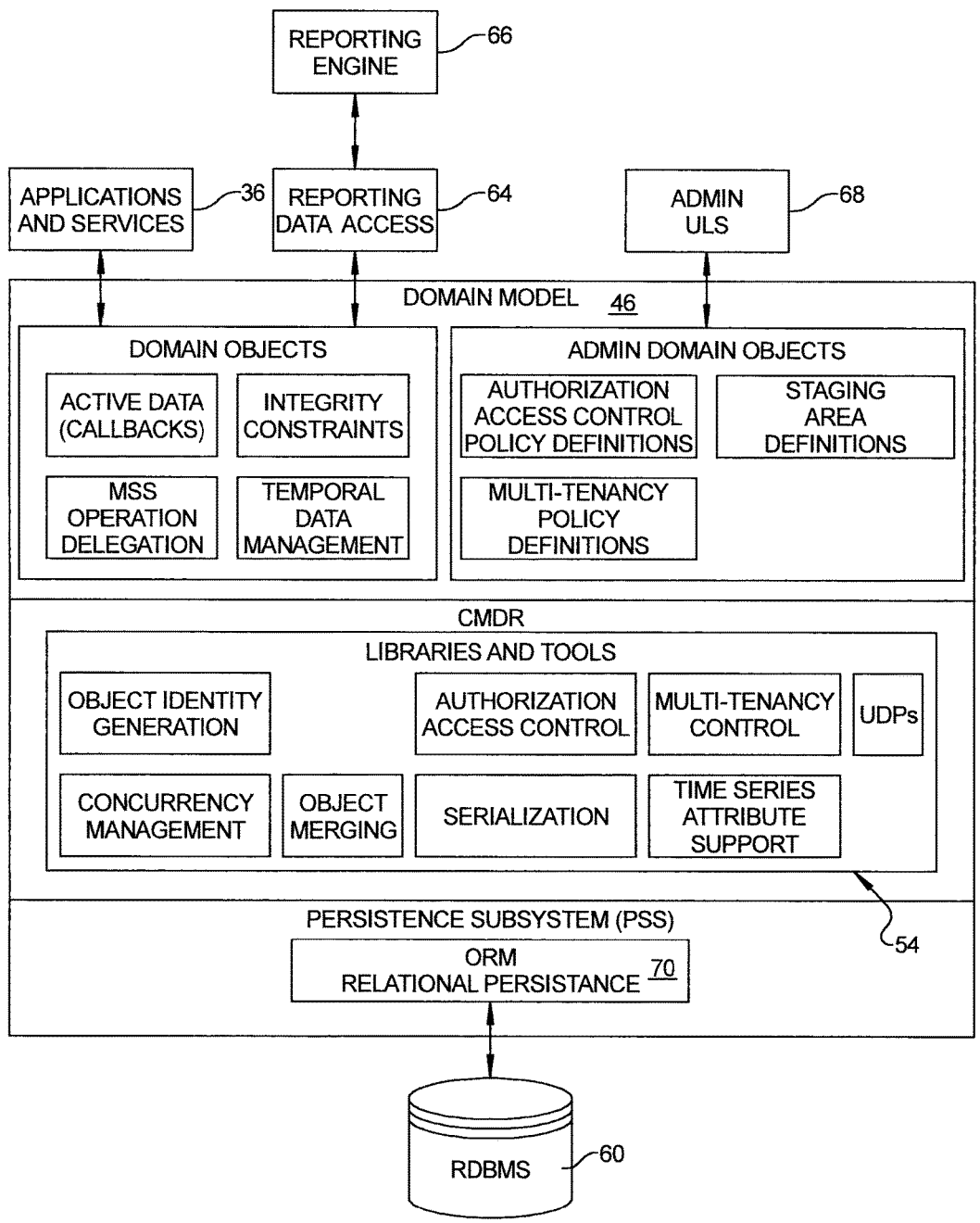
FIG. 7 is a high level block diagram showing the distinction between the domain objects that are used across domain models and DCIM domain objects.

Referring to FIG. 7, the CDMR 54 presents supervision control and data acquisition (SCADA) solution for the entities under management. This interface is tightly coupled to domain objects. The CDMR 54 supports an arbitrary set of domain classes (which constitutes the Domain Model). The CDMR 54 coordinates concurrent object modifications, supports domain object persistence and provides a number of other support services (like object identifier—OID generation conventions/mechanisms). In addition, the CDMR 54 offers a suite of facilities that can be called upon by domain class developers to address cross cutting concerns like authorization resolution/enforcement, multi-tenancy checks, volatile attribute access, etc.

Figure 8:
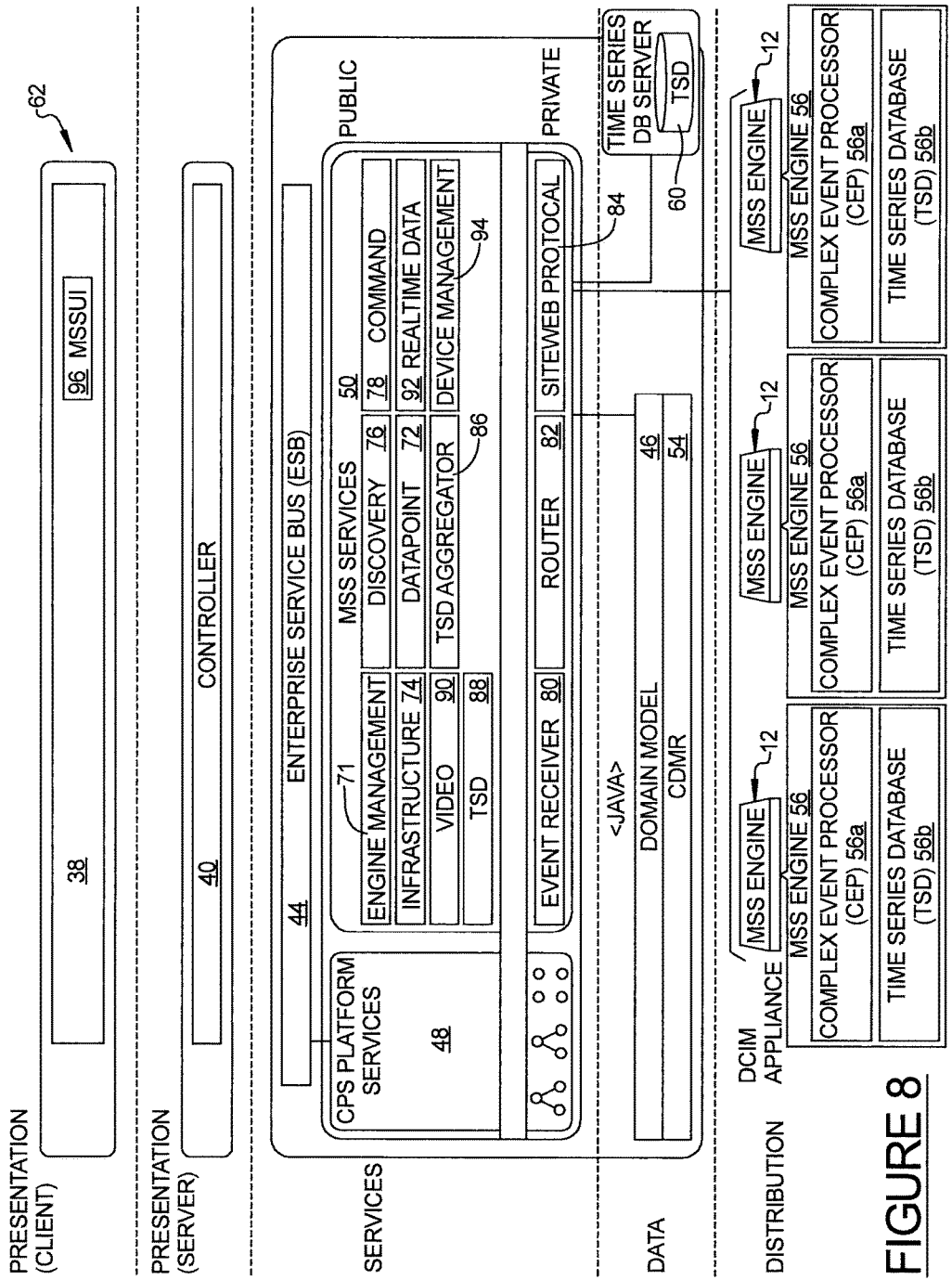
FIG. 8 is a high level block diagram of an architecture showing an interaction of MSS components with the Domain Model and the MSS Engine/DCIM Appliance.

For most purposes the DCIM Domain Model 46 hides a Manageability Subsystem (MSS) 62 that is formed by the MSS Services 50 and the MSS engines 56 (to be discussed further in connection with FIG. 8). Command and control operations are initiated through the Domain Model 46 and are delegated to the MSS subsystem 62 as needed.

Under the covers of the DCIM Domain Model 46, the MSS Engines 56 may reuse the CDMR-supported DCIM Domain Model 46. This obviates the need to design a distinct representation of domain model information—and the need to then map that into (and out of) the CDMR 54 supported DCIM Domain Model 46. This also allows the MSS Engines 56 to reuse the CDMR 54 for final (closest to the device and most recent) checking of authorization policies, multi-tenancy policies, integrity constraints and so on. To support multiple network operation centers, each and every CDMR 54 instance may participate in an eager (ASAP) eventual consistency regime.

The above discussion explains a distinction between the domain objects that are used across domain models and DCIM domain objects. Above, the domain objects that apply across domain models are called 'admin domain objects'. Essentially, these are the domain objects that describe some aspect of other domain objects—e.g., authorization policies (about domain objects), multi-tenancy policies (about domain objects), user defined properties (UDPs—associated with domain objects), etc.

In a literal sense, the depicted 'admin domain objects' are the domain model objects contributed by the 'platform' itself. More specifically, the examples shows are contributed by (and potentially required by) the CDMR 54 component of the platform.

The depicted libraries and tools may comprise the CDMR 54. The first of these may be a reusable (JAVA) library for generating global unique identifiers (GUIDS) to serve as object identifiers. Other libraries may help with resolving/enforcing access controls (e.g., authorization), multi-tenancy controls, user defined property management, serialization (e.g., generic, reflection driven, formatting), etc. In this sense, the dividing line between the Domain Model's 46 class implementations, and the CDMR 54, is somewhat blurred. It may be thought of as something of a dashed line. However, all application/service logic should be strongly insulated from whatever happens under the covers of the domain class interfaces. This effectively raises the level of abstraction at which application/service logic is implemented.

Interaction Requirements

The Domain Model 46, and it's supporting CDMR 54, provides storage agnostic data sharing across the DCIM product line. In addition, the Domain-Model/CDMR duo addresses cross cutting concerns related to data access, delegation of appropriate tasks to the Manageability subsystem (MSS) 62, data change triggers/callbacks, etc. Domain Model 46 consumers are application services, common platform services and even the Manageability Subsystem 62. The MSS Services 50 relays discovery information as new instances of Domain Model 46 classes (stored in the CDMR 54). The Domain Model 46 may represent a single source of truth—and a single source of history.

Applications and Services 36—CRUD Domain Objects as required to support application features.

Reporting Data Access 64—Read only access to the Domain Objects for reporting purposes. This requires a "data provider" for a chosen reporting engine 66.

Admin UIs 68—CRUD Admin Domain Objects defining access policies, multi-tenancy policies, integrity constraint policies and other policies. These policies configure and drive the handling of crosscutting concerns.

Manageability Subsystem 62 delegation—Certain operations (e.g., commands, controls, etc.) associated with domain objects should be delegated to the Manageability Subsystem 62 for ultimate execution. Current, volatile data access (for sensor readings, etc.) should also be delegated to the Manageability Subsystem 62 for real-time fetching (versus latest value/estimate lookup).

ORM/RDBMS 60 access—Domain objects are persisted to the RDBMS 60 via an Object Relational Mapping technology (layer 70). Direct access to the underlying RDBMS is a circumvention of the Domain Model 46 (and supporting CDMR 54) layers. For application/service level logic, direct access to the underlying RDBMS 60 would be a serious architectural violation.

On the other hand, the Domain Model 46 and the CDMR 54 may be deliberately extensible, should specific bits of domain class related logic be best implemented via hand-crafted SQL, stored procedures, etc. When faced with some of the relatively rare, but most challenging, implementation needs, it may be necessary to sprinkle the implementation logic at the application level, the domain model level and even the CDMR/ORM/RDBMS levels.

Reuse

The DCIM product line's common data model leverages domain knowledge manifest in the representational models used in Aperture® Vista, the Avocent® MergePoint™ Infrastructure Explorer (AMIE), the information technology operations management (ITOM) library prototype, DSView, etc. The common data model may also leverage certain aspects of industry standards like the Distributed Management Task Force's (DMTF's) Common Information Model (CIM).

The CDMR 54 may be based on an industry-standard (SQL99) relational database management system (RDBMS).

Some of the most important domain classes, within the Domain Model 46, delegate manageability operations to the Manageability Subsystem 62. In addition, the Manageability Subsystem 62 feeds discovery/presence information, about domain class instances, into the Domain Model 46. Certain policies, for things like correlated event filtering, are also delegated to the Manageability Subsystem 62 for distributed processing (close to the sources of such events).

Manageability Subsystem

Figure 10:
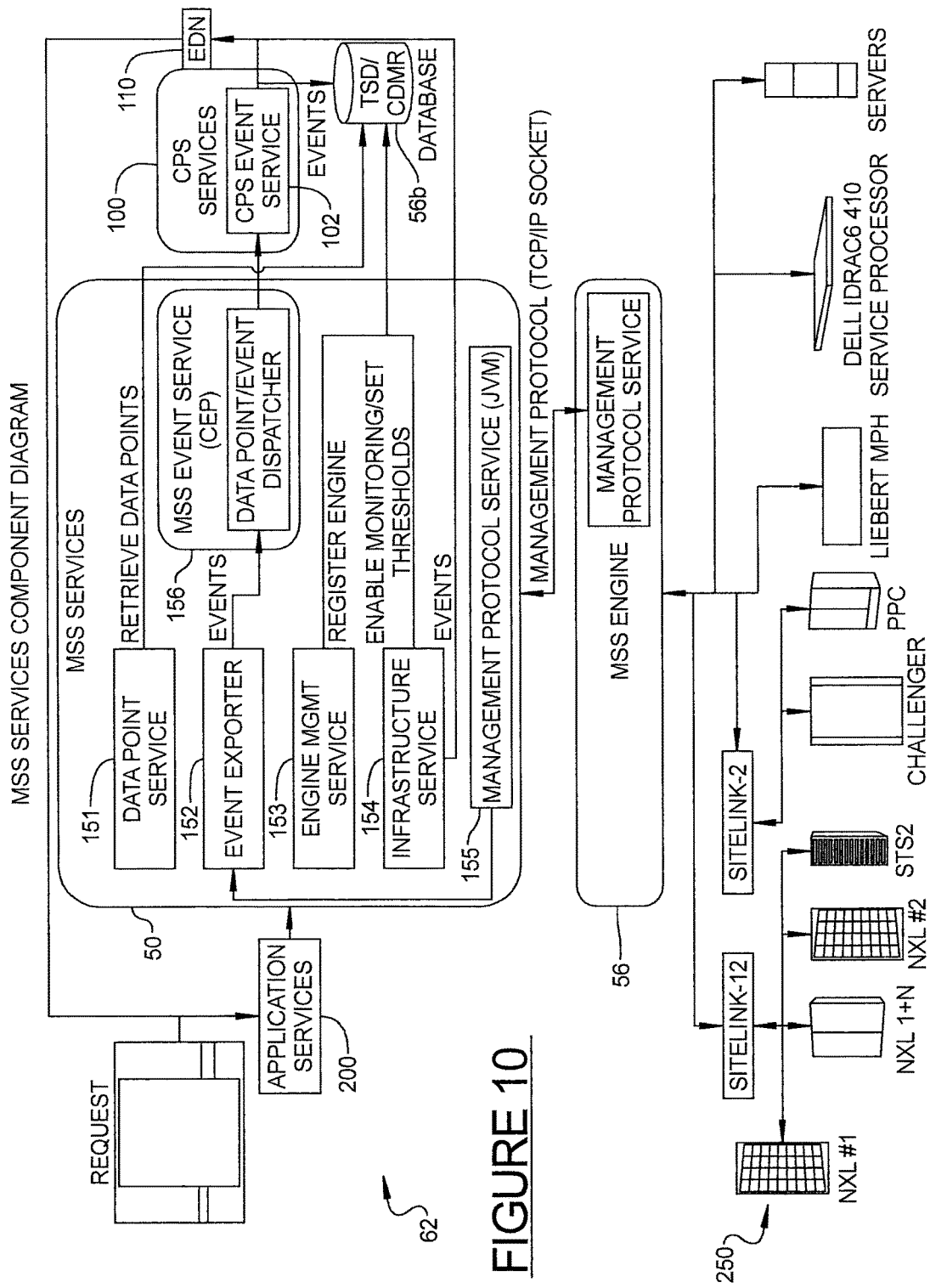
FIG. 10 is high level block diagram showing an example of one architecture of MSS Services.
Figure 11:
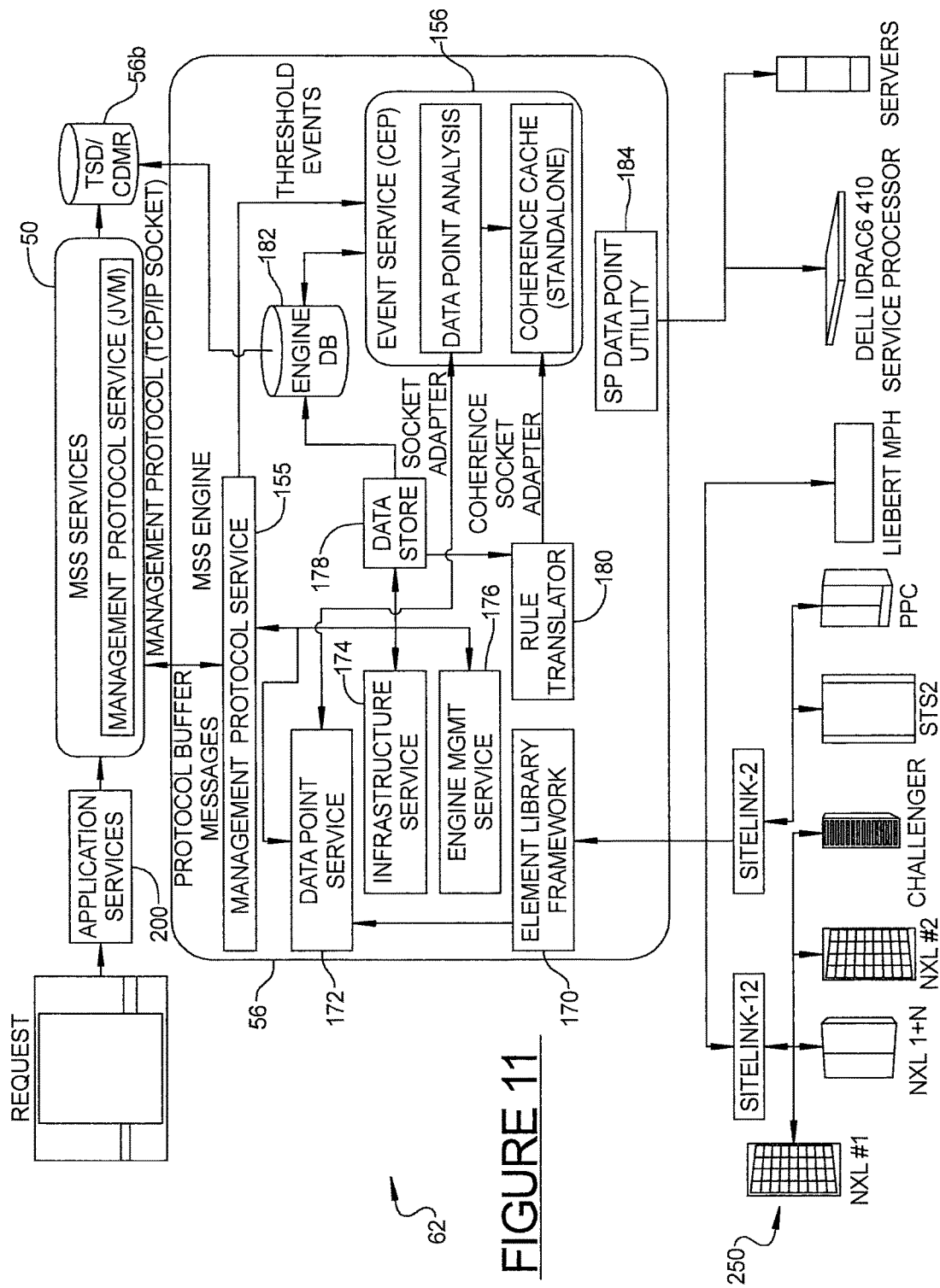
FIG. 11 is high level block diagram showing an example of one architecture of an MSS Engine.

One example of the Manageability Subsystem 62 is shown in greater detail in FIGS. 8 and 10-11. The Manageability Subsystem (MSS) provides the ability to discover and control Emerson and non-Emerson devices, and collect and analyze real time data from those devices, which may be provided to the applications. MSS may be divided up into three major areas:

MSS Services 50—exposes public services on the platform to provide applications and the domain model with access to MSS features such as the retrieval of historical data points that have been collected over time and the retrieval of data points on demand directly from the end devices. Also provides private services used for communication between the platform and the MSS engines 56.

TSD (Time Series Database) 52—stores the historical data points that have been collected over time. Applications and the domain model can retrieve these data points through the public interfaces exposed on the platform.

MSS Engine(s) 56—the software that runs in the DCIM appliance 12 providing discovery and control of Emerson® and non-Emerson devices, and collection and analysis of the real time data from those devices. The MSS engine 56 contains the knowledge for how to communicate with Emerson® and non-Emerson devices. The engine communicates with the MSS services 50 running on the platform. Multiple engines 56 can be deployed in the customer environment to provide scalability as the number of devices to be supported grows. The MSS Engine 56 may use Complex Event Processing (CEP) technologies to ensure real time data aggregation and correlation.

Interaction Requirements

The MSS Services 50 manipulate domain objects via interfaces (such as a Java interface) exposed by the Domain Model for data persistence and access, and may further provide the following features/benefits:

Provide basic create, update, delete, and querying of domain objects;

Used for synchronization of new or updated domain objects identified by discovery of the MSS Engine 56;

Used for synchronization of domain objects between the Platform the MSS Engine; and Access to rules to control data aggregation and data analysis.

Delegate methods of the domain objects in the Domain Model may consume public MSS Services 50 using SOAP or another suitable protocol via an Enterprise Service Bus (ESB) 44. These delegate methods may be used to perform the following activities:

Execution of commands, such as PowerOff;
Retrieve historical metric values;
Retrieve on-demand metric values;
Perform on-demand discovery operations;

The public and private MSS Services 50 may use the Router component to route requests to the appropriate MSS Engine 56.

The MSS Services 50 may consume CPS Platform Services 100 using SOAP or another suitable protocol via the ESB. The CPS Platform Services 100 may be consumed for the following reasons:

Consume Authorization Service to determine that necessary rights for enforcement of functionality provided by the MSS Services 50;

Consume Licensing Service to determine what functionality is available by the MSS Services 50;

Consuming Eventing Service for the publishing of events; and

Consuming Eventing Services for the registration of notifications based on events.

The MSS Services 50 may use a suitable communications component to communicate with the MSS Engine 56.

The MSS Services 50 may interact with the MSS Engine 56 on the DCIM appliance 12 using a suitable communication component to achieve the following functionality:

Command Execution;
Discovery;
Data Collection;
Firmware Upgrades; and
Configuration.

The MSS UI may interact with the Controller over HTTP and the Controller interacts with the MSS Services 50 using SOAP or another suitable protocol (e.g., via the ESB 44).

The Application Services 200 may consume video and real time data streaming via a publication/subscription mechanism from the MSS Services 50. The video and realtime data streaming is retrieved from the MSS Engine 56.

With particular reference to FIGS. 10 and 11, a further embodiment of an exemplary Manageability Subsystem (MSS) 62 is illustrated. Similar to the MSS 62 of FIG. 8, the MSS 62 of FIGS. 10 and 11 may be divided into three major portions: (1) MSS Services 50, (2) MSS Engine(s) 56, and (3) a TSD (Time Series Database) 52. The MSS Services 50 provides an interface between the MSS Engine(s) 56 and the other applications that are part of the DCIM solution 10. The MSS Engine(s) 56 can run on the DCIM appliance 12 or can instead run on a stand-alone hardware component.

MSS Services 50 can be considered a subset of Common Platform Services (CPS Services) 100. The CPS Services 100 may be a software platform that aggregates all events for use by the applications or DCIM 12. The CPS Services 100 may include the CPS Event Service 102 that generates events, for example, by comparing data points with thresholds or other rule based event generation. Additionally, the Application Services 200 may provide the interface between the applications of the DCIM 12 and the MSS Services 50 and the MSS Engine(s) 56. Essentially, Application Services 200 may consume the functionality of the MSS 62 through interaction with MSS Services 50.

The following section briefly describes the components of MSS Services 50 and their interaction with Domain Model and MSS Engine 56/DCIM Appliance 12.

Datapoint Service 151—The Datapoint Service 151 provides the ability to access collected metric data and to configure the rules related to data point collection, aggregation, and analysis. The Datapoint Service 151 can receive requests for data points from applications and, in response thereto, return single data points, aggregated data points and/or subscriptions. Subscriptions include reporting certain data points and/or aggregated data points automatically upon meeting certain conditions or rules.

Event Exporter 152—The Event Exporter 152 service may receive event information, e.g., from an MSS Engine 56 and/or applications, and sends those events to the platform 100 (Common Platform Services or "CPS Services"). The Event Exporter 152 may be similar to the Event Receiver 80 of FIG. 8 described above.

Engine Management 153—The Engine Management 153 service provides the ability to manage Domain Model objects that represent the MSS Engines 56 and related objects, such as product knowledge and plug-ins. The Engine Management 153 service provides the administrative functions for the MSS Engines 56, such as adding, updating and managing MSS Engines 56 that are part of the DCIM solution. Further, the Engine Management 153 service permits applications to register and unregister MSS Engines 56 as necessary.

Infrastructure 154—The Infrastructure 154 service provides the ability to manage the infrastructure (devices, containers, relationships, collection rules, aggregation rules, and analysis rules) of the MSS Engine 56. This service keeps the infrastructure objects synchronized between the domain model (and supporting CDMR) and the MSS Engines 56. As changes and additions are made to Domain Model objects on the platform the necessary information is synchronized with the MSS Engines 56. This service also handles synchronizing new and updated devices/relationships that are discovered by the MSS Engines 56 with the Domain Model of the platform. The Infrastructure service pushes down rules, thresholds and similar information to an MSS Engine 56 to enable monitoring of managed devices. For example, the Infrastructure 154 service allows applications to set threshold rules and set up collection rules, which are pushed down for use by an MSS Engine 56.

Management Protocol Service 155—The Management Protocol Service 155 provides for the communication between the MSS Services 50 and the MSS Engine(s) 56. The Management Protocol Service 155 may provide a single protocol for communication between MSS Services 50 and MSS Engines 56 that is secure and encrypted.

The MSS Event Service 156—The MSS Event Service 156 dispatches events to an Event Delivery Network (EDN) 110 after first providing Complex Event Processing. Events may be generated in at least two ways: (1) from an MSS Engines 56 based on the data received, and (2) through comparison with thresholds, etc. by Complex Event Processing. Further, the MSS Event service 156 can generate an event (1) when communication with an MSS Engine 56 is lost, and (2) when communication with an MSS Engine 56 is regained.

Referring to FIG. 11, the following section briefly describes one example of the components that may be used to form the MSS Engine(s) 56 and their interaction with the MSS Services 50 described above.

Management Protocol Service 155—as described above, the Management Protocol Service 155 may provide for the communication between the MSS Services 50 and the MSS Engine(s) 56. The Management Protocol Service 155 may provide a single protocol for communication between MSS Services 50 and MSS Engines 56 that is secure and encrypted.

Element Library Framework 170—the Element Library Framework 170 may provide a common interface for Element Libraries (including but not limited to the Java Plugin framework). An Element Library may be software that allows for the management (discovery, collection, configuration, etc.) of a set of managed devices. An Element Library can be thought of as two components: (1) a "device driver" for a managed element (or set of elements) and (2) the "product knowledge" associated with a managed element (or set of elements). The "device driver" component may include information related to the protocol to be utilized for communicating with, commanding, etc. a managed element(s). In addition, the "device driver" component may provide for the normalization of messages (data, etc.) sent from the managed devices 250 to a common standard that is understood by the platform, as well as the de-normalization of messages (data, etc.) sent from the platform to the managed devices 250. The "product knowledge" component can contain information related to the various operational characteristics associated with a managed element(s), including but not limited to what communication protocol(s) are supported by the managed elements and what data point(s), event(s) and commands are relevant for and/or collected by the managed elements. Further, a graphical symbol to be utilized by the DCIM 12 can be stored within an element library (or a device package as further described below).

Datapoint Service 172—The Datapoint Service 172 of the MSS Engine(s) 56 may be the companion service to the Datapoint Service 151 of the MSS Services 50 described above, and may provide the ability to access collected metric data and to configure the rules related to data point collection, aggregation, and analysis. The Datapoint service 172 can receive requests for data points from applications and, in response thereto, return single data points, aggregated data points and/or subscriptions. Subscriptions may include reporting certain data points and/or aggregated data points automatically upon meeting certain conditions or rules.

Infrastructure 174—The Infrastructure 174 service of the MSS Engine(s) 56 may be the companion service to the Infrastructure service of the MSS Services, and may provide the ability to manage the infrastructure 154 (devices, containers, relationships, collection rules, aggregation rules, and analysis rules) of the MSS Engine 56. This service keeps the infrastructure objects synchronized between the domain model (and supporting CDMR) and the MSS Engines 56. As changes and additions are made to Domain Model objects on the platform the necessary information is synchronized with the MSS Engines 56. This service may also handle synchronizing new and updated devices/relationships that are discovered by the MSS Engines 56 with the Domain Model of the platform. The Infrastructure 174 service may receive the pushed down rules, thresholds and similar information from the MSS Services 50 to enable monitoring of managed devices. For example, the Infrastructure 174 service may allow applications to set threshold rules and set up collection rules.

Engine Management 176—The Engine Management 176 service of the MSS Engine(s) 56 may be the companion service to the Engine Management 153 service of the MSS Services 50, and may provide the ability to manage Domain Model objects that represent the MSS Engines 56 and related objects, such as product knowledge and plug-ins. The Engine Management 176 service provides the administrative functions for the MSS Engines 56, such as adding, updating and managing MSS Engines 56 that are part of the DCIM solution. Further, the Engine Management 176 service may permit applications to register and unregister MSS Engines 56 as necessary.

Data Store 178—the Data Store 178 may be a memory that stores components of the CDMR needed by the MSS Engine 56 to function.

Rule Translator 180—the Rule Translator 180 may process event and data aggregation rules for Complex Event Processing. The Rule Translator 180 also may translate collection rules for the Datapoint Service 172. The Rule Translator 180 can communicate with the Infrastructure Service 174, e.g., to provide translations of updates and other information received therefrom.

Engine Database 182—the Engine Database 182 may provide an in-engine memory database that buffers the data from the MSS Engine(s) 56 in case of a communication failure/interruption with the TSD 56b.

Service Processor Datapoint Utility 184—the Service Processor Datapoint Utility 184 may provide communication with service processors in external servers. Optionally, the Service Processor Datapoint Utility 184 can also communicate with the Element Library Framework 170 described above.

Use Case Description

There are a number of use cases for the MSS 62 and its various components. The following section sets forth a brief description of a number of example use cases for the MSS Services 50, which are further described with reference to FIGS. 12 to 21.

Start an MSS Engine 56—FIG. 12 illustrates a use case description for the MSS Services 50 to start an MSS Engine 56.

Stop an MSS Engine 56—FIG. 13 illustrates a use case description for the MSS Services 50 to stop an MSS Engine 56 that is in operation.

Install Element Library 170 on an MSS Engine 56—FIGS. 14A and 14B illustrate a use case description for the MSS Services 50 to install an Element Library 170 on an MSS Engine 56.

Update Element Library 170 on an MSS Engine 56—FIGS. 15A and 15B illustrate a use case description for the MSS Services 50 to update an Element Library 170 on an MSS Engine 56.

Uninstall Element Library 170 on an MSS Engine 56—FIG. 16 illustrates a use case description for the MSS Services 50 to uninstall an Element Library 170 on an MSS Engine 56.

Aggregate Datapoints from an MSS Engine 56 On-Demand—FIG. 17 illustrates a use case description for the MSS Services 50 to aggregate datapoints from an MSS Engine 56. Examples of datapoint aggregation may include determination of an average temperature, determination of an average temperature and determination of total power for a number of managed elements.

Retrieve Status of an MSS Engine 56—FIG. 18 illustrates a use case description for the MSS Services 50 to retrieve the status of an MSS Engine 56. Status information includes but is not limited to status information of all managed elements within the MSS Engine 56 (including device definitions and protocols), status information updates of MSS Engine 56 components, and the status information of the MSS Engine 56 server (CPU usage, memory sizes, IP address, MAC address and version, etc.).

Retrieve MSS Engine 56 Statistics—FIG. 19 illustrates a use case description for the MSS Services 50 to retrieve statistics for an MSS Engine 56. Statistical information includes but is not limited to statistical information of the current size of the database storing datapoints and configuration information and statistical information of all managed elements defined within the MSS Engines 56, including device definitions and protocols.

Send Datapoint Changes to Datapoint Subscriber—FIG. 20 illustrates a use case description for the MSS Services 50 to provide a mechanism that allows a datapoint subscriber (such as, an application) to subscribe for datapoint changes in the MSS TSD 56b.

Update Configuration—FIG. 21 illustrates a use case description for the MSS Services 50 to provide configuration updates in the MSS Services 50, MSS Engines 56, and MSS TSD 56b.

The following section sets forth a brief description of a number of use cases for the MSS TSD 56b, which are further described with reference to FIGS. 22 to 26.

Store Datapoints—FIG. 22 illustrates a use case description for the MSS TSD 56b to store datapoints collected by the MSS Engines 56. The MSS TSD 56b will support numeric datapoints. Further, the MSS TSD 56b will be configurable such that a user may set how long datapoints are retained in the TSD 56b.

Summarize Datapoints—FIG. 23 illustrates a use case description for the MSS TSD 56b to summarize datapoints. The MSS TSD 56b provides a mechanism for aggregating collected datapoints, e.g., interval datapoints to hourly values, hourly values to daily values, daily values to weekly values, weekly values to monthly values, monthly values to yearly values, and so on, to generate datapoint summaries. Further, the MSS TSD 56b can compute minimum, maximum and average values for collected datapoints and/or datapoint summaries. The MSS TSD 56b may process datapoint summary configuration settings to indicate time periods and frequency in which data point summary occurs. The MSS TSD 56b may also provide datapoint archiving services. The archiving configuration settings (time, frequency, location of storage, etc.) may be user-adjustable. Upon archiving, the raw data can be deleted from the MSS TSD 56b.

Access to MSS TSD 56b Data Store—FIG. 24 illustrates a use case description for the MSS TSD 56b to provide access to the TSD data store.

Access to MSS TSD 56b Datapoints—FIG. 25 illustrates a use case description for the MSS TSD 56b to provide access to the datapoints within the TSD data store.

Access to MSS TSD 56b Configurations—FIG. 26 illustrates a use case description for the MSS TSD 56b to provide access to the configuration settings of the MSS TSD 56b.

The following section sets forth a brief description of a number of use cases for the MSS Engine 56, which are further described with reference to FIGS. 27 to 54.

The MSS Engines 56 provide for discovery of managed elements in the data center. The discovery feature works with the Element Library Framework 170 to establish communication with managed elements over the network using standard and proprietary protocols. The MSS Engine 56 may support the discovery of IT infrastructure managed elements 250. IT infrastructure managed elements 250 include power devices (e.g., PDUs) and servers. The MSS Engine 56 may also support the discovery of critical infrastructure managed elements 250. Critical infrastructure managed elements 250 may include facility equipment devices (e.g., generators, batteries, and environmental devices).

Upon discovery of a managed element 250, the MSS Engine 56 may retrieve at least the following information where applicable:
 a. Name;
 b. Model;
 c. Hostname;
 d. Serial Number;
 e. MAC Address;
 f. IP Address (multiple addresses if more than one network interface);

g. Number of attached devices; and h. Topology (connectivity to and properties from attached devices).

Upon discovery of a power and cooling managed element, the MSS Engine 56 may retrieve at least the following information where applicable:

Vendor;

Model;

Serial Number;

Maximum Power Capacity; and

Tonnage.

The MSS Engine 56 may:

provide a background discovery process that periodically scans the network for new managed elements;

provide a background discovery process that periodically scans the network for changes to existing managed elements 250 in the MSS Engine Data Store 178;

automatically reconciles detected changes for existing managed elements 250 in the MSS Engine Data Store 178;

have the ability to automatically discover information about an unmanaged element when an unsolicited message is received from that unmanaged element;

provide the ability to configure discovery settings for managed elements in the MSS Engine 56. Examples of discovery settings are credentials (SNMP community strings, username, password and certificates), port numbers (HTTPS port and SNMP port), protocols (SNMP v1/v2 uses community strings), discovery interval, and IP address ranges;

provide the ability to discover managed elements by IP address, subnet mask, and gateway;

provide the ability to discover managed elements 250 by IP address range;

provide the ability to discover managed elements 250 across LANs, WANs, and appliance VLANs; and provide the ability to auto discover managed elements 250 that are manually added by applications. The device information for the managed element should include, at a minimum, the IP address and protocols associated with the managed element.

Auto Discover Managed Elements—FIGS. 27A and 27B illustrate a use case description for the MSS Engines 56 to provide automatic discovery of managed elements 250.

Auto Discover Unmanaged Elements—FIG. 28 illustrates a use case description for the MSS Engines 56 to provide automatic discovery of unmanaged elements.

Discover Manually Added Managed Elements—FIG. 29 illustrates a use case description for the MSS Engines 56 to provide discovery of manually added managed elements.

Collection Feature—The collection feature of the MSS Engine 56 allows the collection, analysis, and storage of data points from managed elements in the data center. The MSS Engine 56 may:

provide the ability to send collected data points to the MSS TSD 56b;

provide the ability to collect numeric data points;

provide the ability to configure the removal of data points in the MSS Engine 56 when the connection to the MSS TSD 56b has been re-established; and have a local data store for the temporary persistence of collected data points from managed elements.

With respect to automatic datapoint collection, the MSS Engine 56 may:

provide the ability to collect data points from managed elements 250 based on collection rules configured by the user (e.g., data point types to collect and how often to collect);

continue to collect data points in the event of a loss of connection with the MSS TSD 56b;

provide the ability to collect data points from managed elements 250 and report data points to the MSS TSD 56b only when the data point value has changed (CoV);

collect environmental data points from the appliance 12 when the MSS Engine 56 is enabled in the appliance 12;

have the ability to configure which data point types should be collected;

have the ability to configure which devices data point collection is occurring on;

have the ability to configure the collection interval per data point on each managed element 250 in the MSS Engine 56. In a data center environment, the minimum collection interval will be 1 minute, the maximum collection interval will be 1 day, and the default collection interval will be 5 minutes;

provide the ability to configure the collection of data points from an MSS Engine 56. This configuration will define how data points are collected;

provide the ability to configure data point parameters for data point collection rules;

provide the ability to perform computations on collected data points based on business logic rules and generate new data points. For example, the MSS Engine 56 can compute energy consumption for managed elements that do not report energy consumption; and provide the ability to configure the change of value (CoV) threshold for each collected data point.

Collect Datapoints based on Time Interval—FIGS. 30A and 30B illustrate a use case description for the MSS Engines 56 to collect datapoints on a time interval.

Collect Environment Datapoints from Appliance 12—FIG. 31 illustrates a use case description for the MSS Engines 56 to collect environment datapoints from an appliance 12.

Compute Datapoints based on Business Logic Rules—FIG. 32 illustrates a use case description for the MSS Engines 56 to collect datapoints based on certain rules.

Collect Datapoints On-Demand—FIG. 33 illustrates a use case description for the MSS Engines 56 to collect datapoints on-demand.

Collect Datapoints based on Events—FIG. 34 illustrates a use case description for the MSS Engines 56 to collect datapoints based on events. The MSS Engine 56 may provide the ability to collect data points from managed elements triggered by event rules. Further, the MSS Engine 56 will provide the ability to configure event rules to trigger the collection of data points from managed elements. As an example, if data points for batteries are being collected once an hour and an event occurs indicating a switch to battery backup has occurred, then a rule can indicate to start collecting the data points for the batteries every minute instead of every hour.

Aggregate Datapoints based on Mathematical Rules—FIG. 35 illustrates a use case description for the MSS Engines 56 to collect and aggregate datapoints based on certain rules. The MSS Engine 56 may provide the ability to synthesize collected data points (e.g., create new data points from other data points) from managed elements based on rules. Further, the MSS Engine 56 may provide the ability to configure data point parameters for data point aggregation rules. The MSS Engine 56 may provide the ability to aggregate collected data points from managed elements based on mathematical rules (e.g., compute minimum, maximum, and average values during a time interval that can be configured in the MSS Engine 56). The aggregated data point values may be stored in the MSS TSD 56b. The MSS Engine 56 may provide the ability to filter on aggregated data points that were created as a result of executing mathematical rules.

Create MSS Engine Events—FIG. 36 illustrates a use case description for the MSS Engines 56 to create MSS Engine events.

Transform Events into MSS Engine Events—FIG. 37 illustrates a use case description for the MSS Engines 56 to transform events into MSS Engine events. The MSS Engine 56 may provide a mechanism for receiving events (e.g., SNMP traps) and transforming these events into MSS Engine events.

Handle Events from Unmanaged Elements—FIG. 38 illustrates a use case description for the MSS Engines 56 to handle events from unmanaged elements.

Handle Unknown Events—FIG. 39 illustrates a use case description for the MSS Engines 56 to handle unknown events. The MSS Engine 56 may handle unrecognized events from managed elements. When the MSS Engine 56 receives such an event, the MSS Engine 56 may indicate that the event is unknown.

Consolidate Events—FIG. 40 illustrates a use case description for the MSS Engines 56 to consolidate events. The MSS Engine 56 may provide the ability to consolidate events (e.g., combine redundant events into a single event) based on rules. The MSS Engine 56 may keep track of the number of event occurrences that are being consolidated. The MSS Services 50 may have the ability to configure rules (e.g., based on a time interval) for how events are consolidated in the MSS Engine 56.

Filter Disabled Events—FIG. 41 illustrates a use case description for the MSS Engines 56 to filter disabled events. The MSS Engine 56 may provide the ability to disable events. When the MSS Engine 56 receives such an event, the MSS Engine 56 may ignore the event. The MSS Services 50 may have the ability to configure rules for how events are disabled in the MSS Engine 56. The MSS Engine 56 may provide the ability to configure how long events are retained on the MSS Engine 56. The MSS Engine 56 may support severity levels (e.g., Critical, Warning, and Information) for events. The MSS Engine 56 may provide the ability to configure the assignment of severity levels to events.

Datapoint thresholds—The MSS Engine 56 may generate an event when a datapoint has exceeded a threshold value. The threshold value may be a numeric or percentage value. The MSS Engine 56 may continue to send events to the MSS Services 50 until the data collected for a managed element is under a given threshold. The MSS Engine 56 may support the ability to configure a threshold based on the data point value being outside a defined percentage or outside a fixed threshold value. The MSS Engine 56 may provide the ability to configure data point threshold rules for managed elements inside a container.

Detect Datapoint Threshold Violations—FIGS. 42A and 42B illustrate a use case description for the MSS Engines 56 to detect datapoint threshold violations.

Control and Command Execution—The MSS Engine 56 may allow the MSS Services 50 to send commands to managed elements. An example of such command is when a user attempts to power off all outlets connected to a managed element. The MSS Engine 56 will have the ability to:

execute commands based on user interaction. The status of the command execution may be sent to the originator of the command.

execute commands triggered by event rules (e.g., when door opens and motion has been detected, start recording video);

configure event rules to trigger the execution of commands;

execute commands based on thresholds; and configure thresholds to trigger the execution of commands.

Execute Commands On-Demand—FIG. 43 illustrates a use case description for the MSS Engines 56 to execute commands on-demand.

Execute Commands Triggered by Events—FIG. 44 illustrates a use case description for the MSS Engines 56 to execute commands that are triggered by Events.

Execute Commands based on Thresholds—FIG. 45 illustrates a use case description for the MSS Engines 56 to execute commands that are based on thresholds.

Synchronize Containers—FIG. 46 illustrates a use case description for the MSS Engines 56 and MSS Services 50 to synchronize information contained in the DCIM Data Store and information contained in the MSS Engine Data Store 178 such as containers, managed elements and their relationships.

Synchronize Topology for Discovered Managed Elements—FIG. 47 illustrates a use case description for the MSS Engines 56 and MSS Services 50 to synchronize the topology for discovered managed elements 250. The MSS Services 50 may allow a user to establish a mapping between data point sources and managed elements (e.g., a building management system assigns data points to devices) in the MSS Engine 56. The MSS Engine 56 may provide a mechanism to synchronize imported properties (e.g., equipment identifiers, IP address, port mapping) from managed elements.

Synchronize Managed Element Properties—FIG. 48 illustrates a use case description for the MSS Engines 56 and MSS Services 50 to synchronize managed element properties.

Set Operating State of Managed Element—FIG. 49 illustrates a use case description for the MSS Engines 56 to set the operating state of a managed element 250. The MSS Engine 56 may have the ability to:

retrieve properties for a managed element;

configure settings for a managed element. These settings include, but are not limited to, communication settings (e.g., SNMP trap settings) associated with the managed element;

restore properties for a managed element. For example, when replacing a failed managed element with a new one, the new managed element can be configured with the same properties from the old managed element;

configure settings for multiple managed elements using a configuration template (e.g., provided within the UI);

set the operating state of a managed element 250. Examples of operating states are normal, maintenance mode, in alarm or non-responding; and retrieve status (e.g., normal, not responding) for managed elements 250.

The Element Library Framework.

The Element Library Framework 170 of the MSS Engine 56 allows element libraries to be added, removed, and updated. It also manages the life cycle of element libraries. A device definition may be created for a managed element or family of managed elements. The device definition may include, but is not limited to, the following information:
  Properties (e.g., model type, vendor, number of ports);
  Actions (e.g., reboot, power on/off/cycle, reset);
  Events (e.g., device powered off);
  Alarms (e.g., door is opened);
  Default Thresholds (e.g., temperature not exceeding a value);
  Protocol (e.g., SNMP);
  Protocol properties (e.g., SNMP community strings);
  Data Points (e.g., temperature, voltage);
  Data Point Types (e.g., numeric, text);
  Data Point Unit of Measurement (e.g., Celsius, Volt, Watt);
  Mechanism to retrieve data point (e.g., SNMP variable index);
  Port Types (e.g., KVM, Power, Serial);
  Port Direction (e.g., Input, Output, Both);
  Device Category (e.g., appliance, cascade, target device, software); and
  Connection Types (e.g., KVM, Power, Virtual).

The device definition will be defined as metadata (e.g., in XML format) so it can be understood and used across applications. The MSS Engine 56 may provide a mechanism to update device definitions. The MSS Engine 56 may allow editing of device definitions for critical infrastructure managed elements. The Element Library Framework 170 in the MSS Engine 56 may:
  be capable of supporting multiple managed element types in a single element library;
  allow element libraries to be added without interrupting the MSS Engine 56 or any application running on the CPS platform 100;
  allow element libraries to be removed without interrupting the MSS Engine 56;
  allow element libraries to be upgraded without interrupting the MSS Engine 56 or any application running on the platform 100;
  allow the loading of an element library and its device definitions without stopping the MSS Engine 56 or any application running on the platform 100;
  allow the loading of managed element protocol drivers without stopping the MSS Engine 56 or any application running on the platform;
  be used to discover managed elements 250 on the network;
  be used to collect data points from managed elements 250; and
  provide the ability to execute commands on managed elements 250.

The SNMP element library in the MSS Engine 56 may support SNMP v1, v2, and v3 traps. New versions of existing element libraries may be backward compatible with existing devices and device definitions. The MSS Engine 56 may allow rolling back to a previous version of an element library. An element library in the MSS Engine 56 may have versioning information that indicates the minimum versions of software that the element library works with. For example, an element library can indicate the minimum version of the device definition and the minimum version of the Trellis appliance firmware it supports.

Connect to Managed Element Using Element Library—FIG. 50 illustrates a use case description for the MSS Engines 56 to connect to a managed element using an element library 170.

Collect Datapoints Using Element Library—FIG. 51 illustrates a use case description for the MSS Engines 56 to collect datapoints using an element library 170.

Execute Commands Using Element Library—FIG. 52 illustrates a use case description for the MSS Engines 56 to execute commands using an element library 170.

Start an Element Library—FIG. 53 illustrates a use case description for the MSS Engines 56 to start an element library 170.

Stop an Element Library—FIG. 54 illustrates a use case description for the MSS Engines 56 to stop an element library 170.

Device Package Generation Process

Figure 55:
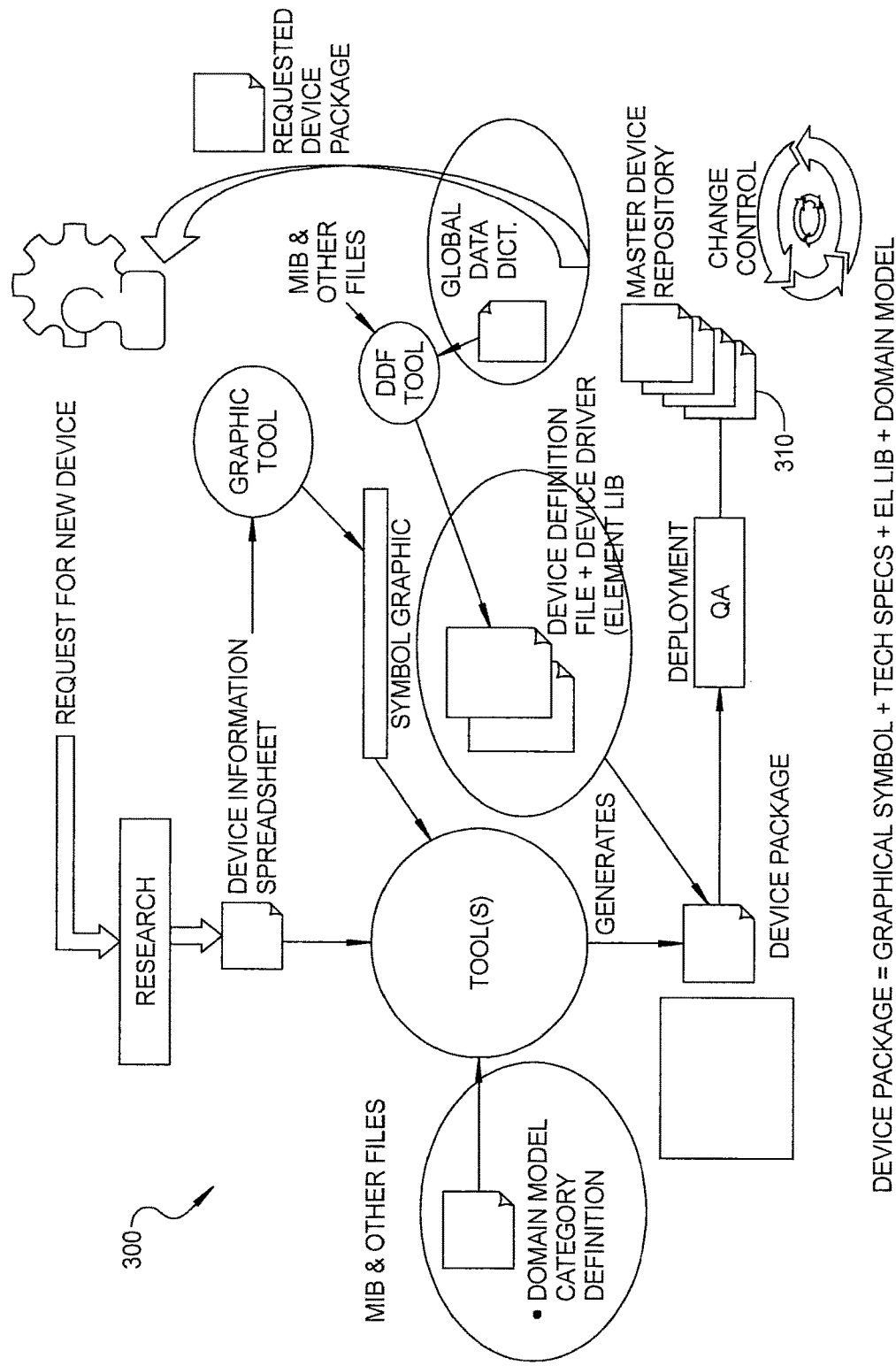
FIG. 55 illustrates a device package generation process.

Referring now to FIG. 55, a device package generation process 300 is shown. In a situation where a new device or element is to be added to the data center, the DCIM 12 may need to retrieve information about the new device in order to perform its various functions. The device package may be generated, for example, by utilizing information from the device information spreadsheet and domain model category definition. A symbol graphic, device definition file and device driver (the element library 170) may also be utilized to generate the device package. In one form, the device package may include the graphical symbol of the device, the technical specifications of the device, the element library of the device and the domain model of the device. Once generated, the device package can be stored in a Master Device Repository 310, which can be included within the DCIM 12 or managed separately to be accessed by the DCIM 12 as necessary.

DCIM Appliance

Figure 9:
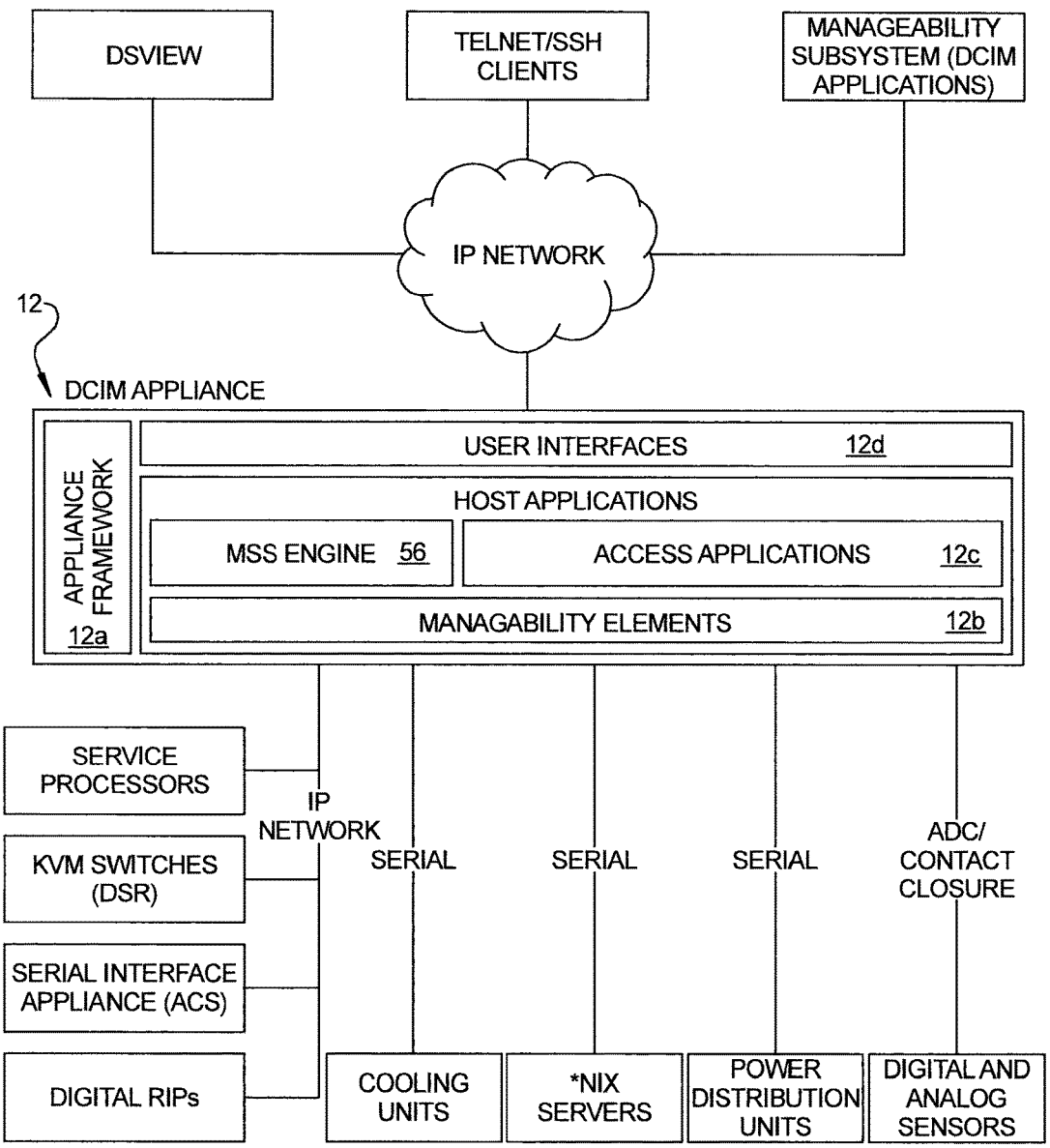
FIG. 9 is high level block diagram showing an example of one architecture of the DCIM Appliance.

The DCIM appliance 12 is shown in one embodiment in FIG. 9. The DCIM appliance 12 provides the MSS Engine 56 capabilities and therefore provides the gateway between the DCIM Solution 10 application layers and the actual infrastructure devices which are being managed. It also provides a collection of industry standard interfaces such as a WebGUI, an SSH/Telnet based CLI, and SMASH/CLP which allow it to provide device management in a stand-alone environment. The external interfaces are purposely limited to provide a subset of the overall functionality available to the DCIM application suite. There are also Avocent specific protocols that may be used for access purposes which are currently consumed by DSView and may eventually be used for DCIM based access applications.

Architecture of DCIM Appliance

The detailed architecture of the DCIM appliance 12 may be thought of (at a high level) as being a system that is divided into at least three major areas including 1) Appliance Framework 12a; 2) Manageability Elements 12b/Access Applications 12c, and 3) User Interfaces 12d.

The Appliance Framework 12a provides a set of common services such as database management, authentication, and others which can be used by all of the components in the DCIM Solution 10. Another important part of the framework is a set of standardized communication interfaces that components can use to move data and messages around the DCIM Solution 10.

The "Manageability Elements 12b" can consist of components that know how to speak to the individual managed devices and equipment. Some examples of managed devices and equipment may include:
  KVM Switches;
  Serial Interface appliances;
  Power Distribution Units (PDUs);
  Digital Rack Interface Pods;
  Service Processors;

Cooling units;
Digital and Analog Sensors; and
3rd Party devices.

This area also includes the Application components which perform various tasks but do not have any external interfaces. The MSS Engine 56 components such as the CEP 56a and the Time Series Database 56b, as well as some extended features inherited from the access appliance, are all examples of applications.

The User Interface 12d may contain the user interfaces such as the Onboard WebUI, command line interfaces, and importantly a MSS Manageability Protocol for communicating with the MSS engines 56. The communication interfaces provided by the appliance framework 12a allow a common method for the UI components to get data and send control messages to the various applications and manageability extensions.

The above described architecture enables the DCIM appliance 12 to be easily deployed in a variety of configurations with support for different numbers and types of managed elements being supported in each configuration. This design based on pluggable components, also allows for easily adding new classes of managed devices as the product line progresses.

CONCLUSION

The DCIM Solution 10 can thus be seen to form a comprehensive family of hardware and software products that provides highly effective and efficient management of data center infrastructure. The DCIM Software Suite shown in FIG. 4 allows the datacenter manager to completely control and manage every aspect of his/her enterprise, whether locally or remotely, from a graphically rich, web-based user interface (UI). The DCIM appliance 12 helps to accomplish this through the use of a single piece of hardware (either per rack, per zone or per data center), where in the past multiple hardware devices/units have been required. Together, the DCIM appliance 12 and the DCIM Software Suite allow the datacenter manager not only to manage his/her current configuration, but to project and plan ahead for future needs, and when those needs become reality, to implement/accommodate them quickly, seamlessly and cost-effectively.

The overall DCIM Solution 10 also enables significant scalability. For one, the DCIM Solution 10 enables an option to connect to a separate database server of a DB server farm; and/or the ability to conform to load balancing systems for web access to a larger user community; and the ability to conform to reporting servers to serve a larger number of report requests. The DCIM Solution 10 also enables the ability to conform to security and access system requirements, and the ability to conform to directory services systems for authentication and authorization and role information for users.

We claim:

1. A system for commanding and controlling a plurality of managed devices, the system comprising:
    one or more memory systems for storing non-transitory, executable machine code adapted to be executed on a processor, the non-transitory, executable machine code being configured to form:
        a manageability services portion (MSS services portion) adapted to facilitate communication between the plurality of managed devices and a central user located remotely from the plurality of managed devices;
        an MSS engine in communication with the MSS services portion, the MSS engine including a memory used for storing an element library including parameters associated with the plurality of managed devices, and the MSS engine being configured to:
            (i) determine what protocol or protocols are supported by each of the managed devices, and to use a required protocol to communicate with each one of the plurality of managed devices to thus facilitate communication between the MSS engine and each one of the plurality of managed devices,
            (ii) create a device definition for each one of the managed devices, the device definition including information pertaining to at least one of a port type to identify a type of port that each said managed device has for communications purposes, or a connection type to define a type of connection to be made with the managed device;
            (iii) discover a new managed device when the new managed device is added to the system,
            (iv) collect non-normalized data generated by, and transmitted from, each one of the plurality of managed devices, and convert the non-normalized data into a normalized form in accordance with a common standard, which can then be sent to a remote platform for use,
            (v) de-normalize data and or messages received from the remote platform so that the de-normalized data and or messages may be sent to the managed devices,
            (vi) aggregate data from each of the plurality of managed devices in accordance with one or more aggregation rules contained in the MSS engine, to thus generate aggregated data for each of the plurality of managed devices,
            (vii) provide the aggregated data for each of the plurality of managed devices to the central user, and
            (viii) provide real-time analytics on the data as it is collected from the plurality of managed devices;
            (ix) provide command and control over the managed devices, and execute commands based on thresholds; and
        a database in communication with the MSS services portion and the MSS engine and adapted to store the data collected by the MSS engine from the plurality of managed devices.

2. The system of claim 1, wherein the parameters stored in the element library include: (i) device drivers for the plurality of managed devices, (ii) the aggregation rules for generating the aggregated data, (iii) configuration variables for each of the plurality of managed devices, and (iv) analytic rules for providing the real-time analytics.

3. The system of claim 1, wherein the parameters stored in the element library further include events that are relevant for the plurality of managed devices, and commands that are relevant for the plurality of managed devices.

4. The system of claim 1, wherein the MSS services portion includes an event service module that generates events based on the collected data.

5. The system of claim 4, wherein the event service module of the MSS services portion utilizes complex event processing to generate events based on collected data.

6. The system of claim 4, wherein the event service module of the MSS services portion utilizes complex event processing to generate events based on the collected data before the collected data is stored in the database.

7. The system of claim 1, wherein the MSS engine includes non-transitory executable machine code that forms an event service portion that generates events based on collected data.

8. The system of claim 7, wherein the event service portion of the MSS engine utilizes complex event processing to generate events based on collected data.

9. The system of claim 7, wherein the event service module portion of the MSS engine utilizes complex event processing to generate events based on collected data before the collected data is stored in the database.

10. The system of claim 1, wherein the MSS services portion communicates at least a portion of collected data to the central user upon receipt of a request.

11. The system of claim 1, wherein the MSS portion communicates at least a portion of collected data to the central user upon generation of an event.

12. The system of claim 1, wherein the MSS engine is further configured to: (i) process collected data from the plurality of managed devices to obtain modified data, and (ii) communicate the modified data to the central user.

13. A method for commanding and controlling a plurality of managed devices using a memory for storing non-transitory machine executable code, where the method using the non-transitory machine executable code operates to:
 implement a manageability services (MSS services) portion in communication with an MSS engine and a database, the method comprising:
 arranging the MSS engine between the plurality of managed devices and the MSS services portion;
 arranging the MSS services portion between the MSS engine and a central user located remotely from the plurality of managed devices;
 arranging an element library with the MSS engine, the element library including information as to what protocol or protocols each one of the managed devices is required to use for communication;
 using the element library to store a device definition for each one of the managed devices, the device definition including information pertaining to at least one of a port type to identify a type of port that each said managed device has for communications purposes, or a connection type to define a type of connection to be made with the managed device;
 causing the MSS engine to use a protocol which is suitable for communicating with each one of the plurality of managed devices, to thus facilitate communication between the MSS engine and the plurality of managed devices and a central user located remotely from the plurality of managed devices;
 discovering a new managed device when the new managed device is added;
 collecting, at the MSS engine, non-normalized data from the plurality of managed devices;
 aggregating, at the MSS engine, data from each of the plurality of managed devices to generate aggregated data in accordance with aggregation rules contained in the MSS engine, for each of the plurality of managed devices;
 providing, at the MSS engine, real-time analytics on the data as it is collected from the plurality of managed devices;
 providing the aggregated data for each of the plurality of managed devices in a normalized form to a remote platform for use by the central user;
 using a database coupled to the MSS services portion and the MSS engine and adapted to store the data collected by the MSS engine from the plurality of managed devices;
 de-normalizing data and or messages received from the remote platform to enable the de-normalized data and or messages to be transmitted to a specific one of the managed devices and to be used by the selected one of the managed devices; and
 performing command and control operations over the plurality of managed devices, and execute commands based on thresholds.

14. The method of claim 13, wherein the MSS services portion includes an event service portion that generates events based on collected data.

15. The method of claim 14, wherein the event service portion of the MSS services portion utilizes complex event processing to generate events based on collected data.

16. The method of claim 14, wherein the event service portion of the MSS services portion utilizes complex event processing to generate events based on the collected data before the collected data is stored in the database.

17. The method of claim 14, wherein the MSS engine includes an event service portion that generates events based on the collected data.

18. The method of claim 17, wherein the event service portion of the MSS engine utilizes complex event processing to generate events based on the collected data.

19. The method of claim 18, wherein the event service portion of the MSS engine utilizes complex event processing to generate events based on the collected data before the collected data is stored in the database.

20. The method of claim 13, further comprising communicating, from the MSS services portion, at least a portion of collected data to the central user upon receipt of a request.

21. The method of claim 13, further comprising: (i) processing the collected data from the plurality of managed devices to obtain modified data, and (ii) communicating the modified data to the central user.

22. A system for commanding and controlling a plurality of managed devices without requiring modification of the managed devices, the system comprising:
 one or more memory systems for storing non-transitory, executable machine code adapted to be executed on a processor, the non-transitory, executable machine code being configured to form:
 a manageability services portion (MSS services portion) adapted to facilitate communication between the plurality of managed devices and a central user located remotely from the plurality of managed devices;
 an MSS engine in communication with the MSS services portion, the MSS engine including a memory used for storing an element library, the element library including information as to what plurality of protocols are supported by each one of the plurality of managed devices to enable communication with each one of the plurality of managed devices, the element library further including information as to at least one of events, data points or commands that are relevant to each one of the plurality of managed devices, and the element library further including a device definition for each one of the managed devices, the device definition including information pertaining to at least one of a port type to identify a type of port that each said managed device has for communications purposes, or a connection type to define a type of connection to be made with the managed device;

the MSS engine being configured to:
discover a new managed device when the new managed device is placed in communication with the MSS engine;

facilitate communication between the plurality of managed devices and the MSS services portion using a protocol required by each said one of the plurality of managed devices, collect non-normalized data generated by, and transmitted from, each one of the plurality of managed devices, and convert the non-normalized data into a normalized form in accordance with a common standard for transmission to a remote platform, and receive normalized data from the remote platform and de-normalize the data to enable transmission to, and use of, the data by a selected one of the managed devices using a specific protocol required by the selected one of the managed devices;

perform command and control operations over the plurality of managed devices, and execute commands based on thresholds; and a database in communication with the MSS services portion and the MSS engine and adapted to store the data collected by the MSS engine from the plurality of managed devices.

* * * * *